United States Patent
Fuji et al.

(10) Patent No.: US 8,446,698 B2
(45) Date of Patent: May 21, 2013

(54) MAGNETORESISTIVE ELEMENT, MAGNETIC HEAD ASSEMBLY, AND MAGNETIC RECORDING/REPRODUCING APPARATUS

(75) Inventors: Yoshihiko Fuji, Kanagawa-ken (JP); Michiko Hara, Kanagawa-ken (JP); Hideaki Fukuzawa, Kanagawa-ken (JP); Hiromi Yuasa, Kanagawa-ken (JP); Shuichi Murakami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,565

(22) Filed: Sep. 15, 2011

(65) Prior Publication Data
US 2012/0206837 A1    Aug. 16, 2012

(30) Foreign Application Priority Data
Feb. 14, 2011   (JP) ............... P2011-029021

(51) Int. Cl.
*G11B 5/48*   (2006.01)
(52) U.S. Cl.
USPC .......................................................... 360/313
(58) Field of Classification Search
USPC ............... 360/313, 319, 324, 294.1
See application file for complete search history.

(56) References Cited

U.S. PATENT DOCUMENTS

| | | | |
|---|---|---|---|
| 6,462,641 B1 * | 10/2002 | Dieny et al. ................. | 338/32 R |
| 7,006,337 B2 * | 2/2006 | Dieny et al. .................. | 360/324 |
| 7,301,733 B1 | 11/2007 | Fukuzawa et al. | |
| 7,390,584 B2 * | 6/2008 | Daughton et al. ......... | 428/811.2 |
| 7,542,234 B1 * | 6/2009 | Goodknight et al. .... | 360/130.21 |
| 7,742,262 B2 * | 6/2010 | Fukuzawa et al. ....... | 360/324.12 |
| 8,213,130 B1 * | 7/2012 | Fuji et al. ..................... | 360/324 |
| 2003/0039078 A1 * | 2/2003 | Li et al. .......................... | 360/314 |
| 2006/0023372 A1 * | 2/2006 | Fukuzawa et al. ......... | 360/324.1 |
| 2008/0253174 A1 * | 10/2008 | Yoshikawa et al. .......... | 365/158 |
| 2012/0212857 A1 * | 8/2012 | Fuji et al. ..................... | 360/244 |

FOREIGN PATENT DOCUMENTS

| | | |
|---|---|---|
| JP | 2002-208744 | 7/2002 |
| JP | 2004-6589 | 1/2004 |
| WO | WO 2011/064822 A1 | 6/2011 |

\* cited by examiner

*Primary Examiner* — Allen T Cao
(74) *Attorney, Agent, or Firm* — Oblon, Spivak, McClelland, Maier & Neustadt, L.L.P.

(57) ABSTRACT

A magnetoresistive element includes a lamination body and a pair of electrodes. The lamination body includes a first magnetic layer, a second magnetic layer, and a spacer layer. The spacer layer is provided between the first magnetic layer and the second magnetic layer and includes an oxide layer. The oxide layer includes at least one element selected from the group consisting of Zn, In, Sn, and Cd, and at least one element selected from the group consisting of Fe, Co, and Ni.

17 Claims, 16 Drawing Sheets

MAGNETORESISTIVE ELEMENT, MAGNETIC HEAD ASSEMBLY, AND MAGNETIC RECORDING/REPRODUCING APPARATUS

CROSS REFERENCE TO RELATED APPLICATION

This application is based upon and claims the benefit of priority from the prior Japanese Patent Application No. 2011-029021, filed on Feb. 14, 2011, the entire contents of which are incorporated herein by reference.

FIELD

Embodiments relate basically to a magnetoresistive element and a manufacturing method thereof.

BACKGROUND

A CPP (Current Perpendicular to plane)-GMR element employs a metal layer for a spacer layer thereof. The metal layer has lower resistance to make the CPP-GMR element more advantageous than a TMR element. However, there has been a problem that the CPP-GMR element cannot provide a sufficiently high MR change rate.

A configuration of the CPP-GMR element or a material of a spacer layer to be included therein has been modified in order to solve such a problem.

For example, JPA1997-147579 discloses that a spacer layer of the CPP-GMR element is not a simple metal layer but includes an oxide layer having a current path (NOL: nano-oxide layer). The current path allows a current to flow in a thickness direction of the oxide layer. The CPP-GMR element provides a CCP (current-confined-path) effect to enable it to increase an MR change rate. Such an element is called a CCP-CPP element.

In addition to the above disclosure, JPA2004-6589 discloses that a magnetoresistive element in which a thin-film spin filter (SF) layer is inserted in the magnetic layer or between the magnetic layer and a nonmagnetic spacer layer. The thin-film spin filter layer includes an oxide or a nitride. The SF layer provides a spin filter effect to prevent either an up-spin electron or a down-spin electron from passing therethrough, thereby enabling it to increase an MR change rate.

BRIEF DESCRIPTION OF DRAWINGS

Aspects of this disclosure will become apparent upon reading the following detailed description and upon reference to accompanying drawings.

DESCRIPTION

Figure 1:
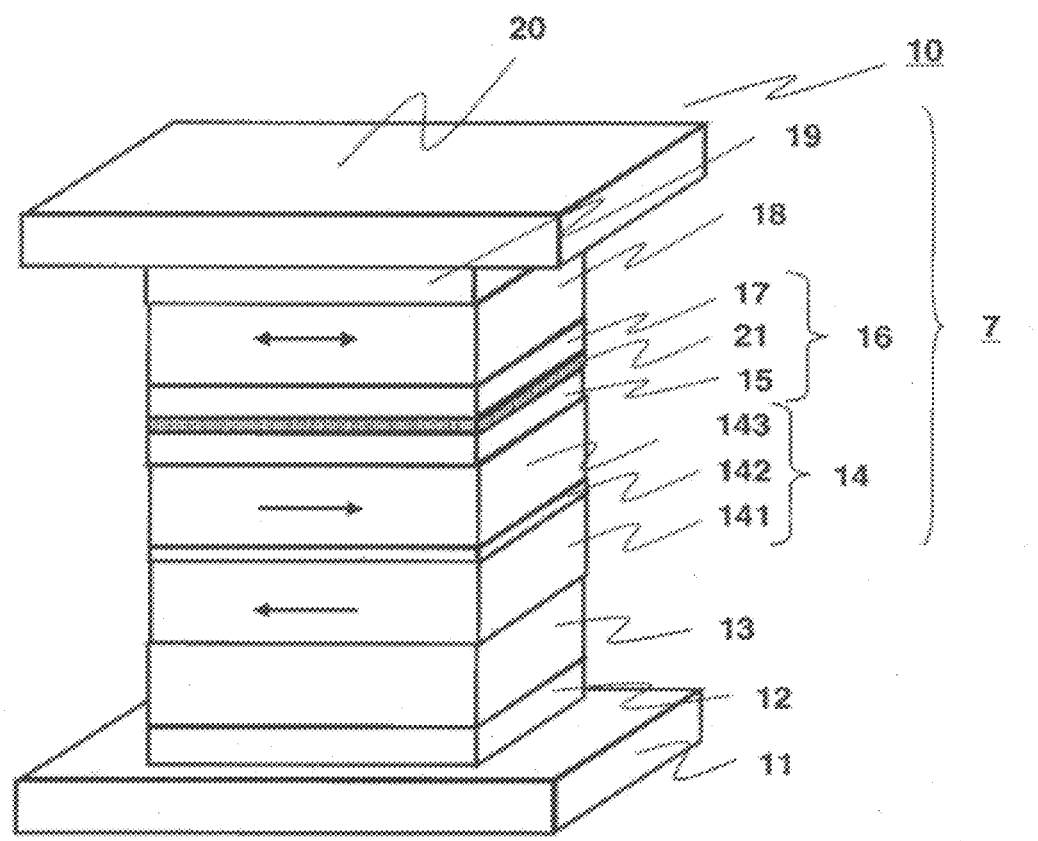
FIG. 1 is a view showing a configuration of a magnetoresistive element in accordance with a first embodiment.

Embodiments will be described below with reference to drawings. Wherever possible, the same reference numerals or marks will be used to denote the same or like portions throughout figures. The drawings are conceptual. Therefore, a relationship between a thickness and a width of each portion and a proportionality factor among the respective portions are not necessarily the same as an actual thing. Even when the same portions are drawn, their sizes or proportionality factors may be drawn differently from each other with respect to the drawings.

As will be described below, according to an embodiment, a magnetoresistive element includes a lamination body and a pair of electrodes. The lamination body includes a first magnetic layer, a second magnetic layer, and a spacer layer. The spacer layer is provided between the first magnetic layer and the second magnetic layer, and includes an oxide layer. The oxide layer includes at least one element selected from the group consisting of Zn, In, Sn, and Cd, and at least one element selected from the group consisting of Fe, Co, and Ni.

First Embodiment

FIG. 1 is a view showing a configuration of a magnetoresistive element 10 in accordance with a first embodiment.

The magnetoresistive element 10 in accordance with the first embodiment is provided with a lamination body 7, a pair of electrodes 11, 20, a pinning layer 13, and an underlayer 12. The lamination body 7 includes the followings:
a cap layer 19 to protect the magnetoresistive element 10 from degradation, e.g., oxidation;

a magnetization fixed layer (a pinned layer) 14 of which magnetization is fixed (pinned);
a magnetization free layer 18 having magnetization to be freely rotatable and being provided between the cap layer 19 and the magnetization fixed layer 14;
an intermediate layer (referred to as a spacer layer 13 below) being provided between the magnetization fixed layer 14 and the magnetization free layer 18; and
an oxide layer 21 being provided in the spacer layer 16 and including at least one element selected from the group consisting of Zn, In, Sn and at least one element selected from the group consisting of Fe, Co, and Ni.

The pinning layer 13 includes an antiferromagnetic body to fix a magnetization direction of the magnetization fixed layer 14 and is provided between the magnetization fixed layer 14 and the electrode 11. The underlayer 12 is provided between the pinning layer 13 and the electrode 11.

As shown in FIG. 1, the spacer layer 16 includes the oxide layer 21 as a spin filter layer (referred to as "SF layer" below). The oxide layer 21 includes at least one element selected from the group consisting of Zn, In, Sn and at least one element selected from the group consisting of Fe, Co, and Ni. The oxide layer 21 has a spin filter effect to control a pass of an upspin electron and a downspin electron, and can include a mixed oxide of Fe and Zn. Such a mixed oxide provides a higher MR change rate and a low areal resistance than an oxide including an element selected from the group consisting of Zn, In, Sn, and Cd or an oxide including an element selected from the group consisting of Fe, Co, and Ni.

The mixed oxide enables it to enhance spin-dependent scattering and to reduce spin-flip as a result of the low resistivity thereof. This is the reason that the higher MR change rate is enabled. The SF layer preferably includes ZnO, $In_2O_3$, $SnO_2$, ZnO, CdO, $CdIn_2O_4$, $Cd_2SnO_4$, and $Zn_2SnO_4$, all of which includes Zn, In, Sn, and Cd to provide their low resistivities. These oxide semiconductors have a band gap of 3 eV or more. A little reduction of these oxides makes the chemical compositions thereof deviate from stoichiometric compositions thereof, thereby forming donor levels due to intrinsic defects such as oxygen vacancies. For this reason, the density of conduction electrons is not less than $10^{18}$ cm$^{-3}$ and not more than $10^{19}$ cm$^{-3}$. In the band structure of the conductive oxides, a valence band of the oxides is formed mainly of 2p-orbitals of oxygen atoms, and a conduction band is formed mainly of s-orbits of metal atoms. When carrier density increases up to more than $10^{12}$ cm$^{-3}$, a Fermi level reaches the conduction band to degenerate. Such an oxide semiconductor is referred to as an n-type degenerated semiconductor in which high-density conduction electrons with high mobility are induced in the n-type degenerated semiconductor. The high-density conduction electrons provide such an oxide semiconductor with a low resistivity.

On the other hand, in order to provide the SF layer with a high spin-dependent scattering performance, the SF layer preferably includes oxides of Co, Fe, and Ni to exhibit magnetism at room temperature. Oxides including Zn, In, Sn, and Cd which are effective for a low resistivity have no magnetism as a bulk property. When an ultra-thin oxide layer is inserted in a magnetization free layer or a magnetization fixed layer, the intrinsically nonmagnetic ultra-thin oxide layer develops magnetism to provide a spin filter effect (see JPA2004-6589, for example). When the ultra-thin oxide layer includes oxides of Co, Fe, and Ni, the ultra-thin oxide layer develops magnetism without control of the film thickness thereof more easily to provide a higher spin filter effect than an ultra-thin oxide layer including no oxide of Co, Fe, or Ni. Zn belongs to the same period as those of Fe, Co and Ni in a periodic table. Therefore, when Zn is mixed with Fe, Co, and Ni to form a mixed oxide thereof, Zn gives magnetism to the mixed oxide more easily than In, Sn, and Cd to stabilize the magnetism of the oxide layer.

Magnetoresistive elements in accordance with embodiments will be described in detail with reference to drawings below.

In FIG. 1, the lower and upper electrodes 11, 20 pass a current in a direction perpendicular to the layers included in the magnetoresistive element 10. Applying a voltage between the lower and upper electrodes 11, 20 allows a current to pass through the magnetoresistive element 10 in the direction perpendicular to the layers.

Passing the current therethrough allows it to detect a change in resistance due to the magnetoresistive effect. The lower and upper electrodes 11, 20 employ Cu, Au, etc. having a comparatively low resistance to pass a current through the magnetoresistive element 10.

The underlayer 12 includes a laminated structure of a buffer layer and a seed layer, for example. Here, the buffer layer is disposed on the side of the lower electrode 11 and the seed layer is disposed on the side of the pinning layer 13.

The buffer layer reduces surface roughness of the lower electrode 11 and improves crystallinity of a layer laminated thereon. The buffer layer can employ Ta, Ti, V, W, Zr, Hf, Cr(s), or alloys of these elements. A preferable film thickness of the buffer layer is not less than 1 nm and not more than 10 nm. A more preferable film thickness thereof is not less than 2 nm and not more than 5 nm. A too thin layer does not serve as a buffer layer. A too thick buffer layer increases a serial resistance which does not contribute to an MR change rate. When a layer formed on the buffer layer serves a buffer layer, there is no need to provide a buffer layer. A 1 nm-thick Ta layer can be formed as a preferable example of the buffer layer.

A seed layer controls crystalline orientation and grain size of a layer laminated thereon. As the seed layer, metals having an fcc structure (face-centered cubic structure), an hcp structure (hexagonal close-packed structure) or a bcc structure (body-centered cubic structure) are preferably employed.

The seed layer employs a Ru layer having an hcp structure or a NiFe layer having an fcc structure to provide a spin valve film laminated thereon with an fcc (100) crystalline orientation. When the pinning layer 13 employs IrMn and PtMn, the pinning layer 13 is provided with an excellent fcc (111) orientation and an ordered fct (111) structure (face-centered tetragonal structure), respectively. Moreover, the magnetization free layer 18 and the magnetization fixed layer 14 employ an fcc metal and a bcc metal to be provided with an excellent fcc (111) orientation and an excellent bcc (110) orientation, respectively. A preferable thickness of the seed layer is not less than 1 nm and not more than 5 nm. A more preferable thickness thereof is not less than 1.5 nm and not more than 3 nm. Both the thicknesses allow the seed layer to serve as a seed layer to enhance the crystalline orientation of a layer laminated thereon. A 2 nm-thick Ru layer is a preferable example of the seed layer.

NiFe-base alloys, e.g., $Ni_xFe_{100-x}$ (x=90 to 50, preferably 75 to 85) or nonmagnetic $(Ni_xFe_{100-x})_{100-y}Z_y$ with a third additive Z (Z=Cr, V, Nb, Hf, Zr, or Mo) may be employed as a seed layer instead of Ru. When the NiFe-base alloy is employed for the seed layer, it is comparatively easy to provide the seed layer with an excellent crystalline orientation of which X-ray rocking curve has a half-value width of 3° to 5°.

The seed layer not only enhances a crystalline orientation of a layer laminated thereon, but also controls the grain size of the layer laminated thereon. Specifically, it is possible to set the grains of the layer laminated on the seed layer to not less than 5 nm and not more than 20 nm in size, thereby enabling a high MR change rate without variations in characteristics of a magnetoresistive element to be miniaturized.

In addition, the grains of the seed layer are set to not less than 5 nm and not more than 20 nm in size to reduce electron diffused reflection and electron inelastic scattering both being caused by grain boundaries in the seed layer. A 2 nm-thick Ru layer is formed in order to provide grains with such size. Moreover, when $(Ni_xFe_{100-x})_{100-y}Z_y$ (Z=Cr, V, Nb, Hf, Zr, or Mo as a third additive) is employed for the material of the seed layer, a 2 nm-thick seed layer of $(Ni_xFe_{100-x})_{100-y}Z_y$ is formed with a third-additive composition y of 0% to 30% (including 0%).

The grain size of the layer laminated on the seed layer can be estimated by observing grain size of a layer disposed between the seed layer and the spacer layer 16, e.g., using a cross-sectional TEM. In a bottom-type spin valve film where the magnetization fixed layer 14 is located under the spacer layer 16, the grain size of both the pinning layer 13 (antiferromagnetic layer) and the magnetization fixed layer 14 (i.e., magnetization fixed layer) is estimated mostly by the grain size of the seed layer.

The pinning layer 13 gives unidirectional anisotropy to the magnetization fixed layer 14 formed thereon to pin the magnetization of the magnetization fixed layer 14. Materials of the pinning layer 13 include IrMn, PtMn, PdPtMn, and RuRhMn, all of which are antiferromagnetic. Among the above-mentioned antiferromagnetic materials, IrMn is advantageous for a magnetic head for high storage density. Even an IrMn layer thinner than a PtMn layer can give the unidirectional anisotropy to a magnetization fixed layer laminated thereon. Accordingly, the IrMn layer is suitable for narrowing a gap of the magnetic head.

In order to give sufficient strength of the unidirectional anisotropy, the film thickness of the pinning layer 13 is appropriately set. When PtMn or PdPtMn is employed for the pinning layer 13, the film thickness thereof is not less than 8 nm and not more than 20 nm. When IrMn is employed for the pinning layer 13, even the IrMn layer, i.e., the pinning layer 13 thinner than a PtMn layer, etc. can give the uniaxial anisotropy. A preferable film thickness of the IrMn layer is not less than 4 nm and not more than 18 nm. A more film preferable thickness thereof is not less than 5 nm and not more than 15 nm. A 7 nm-thick $Ir_{22}Mn_{78}$ can be employed for the pinning layer, for example.

As the pinning layer 13, a hard magnetic layer can be employed instead of the antiferromagnetic layers. Materials of the hard magnetic layer include CoPt (Co=50%-85%), $(Co_xPt_{100-x})_{100-y}Cr_y$ (x=50 to 85, y=0 to 40), and FePt (Pt=40%-60%) to be employed. The hard magnetic layer (e.g., CoPt) has a comparatively small specific resistance to control an increase in a series resistance and an areal resistance RA (i.e., Resistance×Area).

Here, the areal resistance RA is defined as a product of an area by a resistance. The area is a cross section of the magnetoresistive element 10 through which a current is passed in the lamination direction thereof. The resistance is measured between the two electrodes through which the current is passed.

The spin valve film and the pinning layer 13 are evaluated for a crystalline orientation using an X-ray diffraction method. The half-value widths of the X-ray rocking curves are estimated to be 3.5° to 6° for the fcc (111) peaks of the spin valve film, and for the fct (111) peak or bcc (110) peak of the pinning layer 13 (PtMn). That is, the spin valve film and the pinning layer 13 are provided with excellent crystalline orientations. In addition, the dispersion angles, i.e., the half-value widths for the crystalline orientations can be identified in terms of diffraction spots of a cross-sectional TEM.

The magnetization fixed layer 14 includes a multilayer where a lower magnetization fixed layer 141, a magnetic coupling layer 142, and an upper magnetization fixed layer 143 are laminated in this order from the side of the pinning layer 13.

The pinning layer 13 and the lower magnetization fixed layer 141 are magnetically exchange-coupled with each other so that unidirectional anisotropy is provided thereto. The lower magnetization fixed layer 141 and the upper magnetization fixed layer 143 sandwiches in the magnetic coupling layer 142 therebetween, and are strongly coupled with each other so that the magnetization directions thereof become anti-parallel to each other.

Materials of the lower magnetization fixed layer 141 include a $Co_xFe_{100-x}$ alloy (x=0 to 100), a $Ni_xFe_{100-x}$ alloy (x=0 to 100), and these alloys with nonmagnetic elements added. Moreover, the materials of the lower magnetization fixed layer 141 include single elements, such as Co, Fe, and Ni, and alloys of these. Alternatively, a $(Co_xFe_{100-x})_{100-y}B_x$ alloy (x=0 to 100, y=0 to 30, B is boron) may be employed for the lower magnetization fixed layer 141. Employing an amorphous alloy, e.g., a $(Co_xFe_{100-x})_{100-y}B_x$ alloy preferably enables it to reduce variations from sample to sample of magnetoresistive elements when the magnetoresistive elements are miniaturized.

The film thickness of the lower magnetization fixed layer 141 is preferably not less than 1.5 nm and not more than 5 nm. The confined thickness is to strengthen unidirectional anisotropy and an antiferromagnetic coupling field. The unidirectional anisotropy is due to the pinning layer 13. The antiferromagnetic coupling field is a coupling magnetic field between the lower magnetization fixed layer 141 and the upper magnetization fixed layer 143 via the magnetic coupling layer 142.

Moreover, if the lower magnetization fixed layer 141 is too thin, the upper magnetization fixed layer 143 affecting the MR change rate must be thin. The thin upper magnetization fixed layer 143 reduces the MR change rate. On the other hand, if the lower magnetization fixed layer 141 is too thick, it becomes difficult to give a sufficient unidirectional anisotropy field necessary for the operation of the magnetoresistive element.

Moreover, when a magnetic film thickness of the lower magnetization fixed layer 141 is taken into consideration, the magnetic film thickness thereof is almost the same as that of the upper magnetization fixed layer 143. The magnetic film thickness is defined as a product of saturation magnetization Bs by a film thickness t (Bs·t product). That is, the magnetic film thicknesses of the upper and lower magnetization fixed layers 143, 141 are preferably equal to each other.

For example, when the upper magnetization fixed layer 143 is a 3 nm-thick $Fe_{50}Co_{50}$ layer, the saturation magnetization of a thin $Fe_{50}Co_{50}$ film is 2.2 T. As a result, the magnetic film thickness of the 3 nm-thick $Fe_{50}Co_{50}$ layer is 2.2 T×3 nm=6.6 Tnm. A $Co_{75}Fe_{25}$ layer has saturation magnetization of about 2.1 T. The film thickness equivalent to the above magnetic film thickness, i.e., 6.6 Tnm is 6.6 Tnm/2.1 T=3.15 nm of which value corresponds to the film thickness of the lower magnetization fixed layer 141. Therefore, a 3.2 nm-thick $Co_{75}Fe_{25}$ layer is preferably employed for the lower magnetization fixed layer 141.

Here, a symbol '/' denotes a sequential lamination of two layers from a layer of the substance written on the left side of the symbol. For example, Au/Cu/Ru shows that a Cu layer is laminated on an Au layer and a Ru layer is further successively laminated on the Cu layer. Moreover, '×2' denotes that the same multilayers are double laminated. For example, (Au/Cu)×2 shows the following serial lamination steps:
A first Cu layer is laminated on a first Au layer;
A second Au layer is laminated on the first Cu; and
A second Cu layer is laminated on the second Au layer.
Moreover, '[ ]' denotes a film thickness of the substance.

The magnetic coupling layer 142 couples the lower magnetization fixed layer 141 and the upper magnetization fixed layer 143 antiferromagnetically with each other. The lower magnetization fixed layer 141 and the upper magnetization fixed layer 143 sandwich in the magnetic coupling layer 142 therebetween to form a synthetic pin structure. Ru can be employed for the magnetic coupling layer 142. In such a case, the film thickness of the magnetic coupling layer 142 is not less than 0.8 nm and not more than 1 nm. Alternatively, any material other than Ru may be employed for the magnetic coupling layer 142, provided that the material to be employed therefor couples the lower and upper magnetization fixed layers 141, 143 antiferromagnetically with each other. When the film thickness of the magnetic coupling layer 142 is not less than 0.8 nm and not more than 1 nm, the film thickness thereof corresponds to a second peak of RKKY (Ruderman-Kittel-Kasuya-Yoshida) coupling. Alternatively, the film thickness thereof may be not less than 0.3 nm and not more than 0.6 nm as corresponding to a first peak of the RKKY coupling. Here, a 0.9 nm-thick Ru layer allows it to provide reliable and stable coupling, for example.

The upper magnetization fixed layer 143 is a magnetic layer to directly contribute to an MR effect. Therefore, both the material employed for the upper magnetization fixed layer 143 and the thickness thereof become important to provide a high MR change rate.

$Fe_{50}Co_{50}$ can be employed for the upper magnetization fixed layer 143. $Fe_{50}Co_{50}$ is a magnetic material having a bcc structure. This material, i.e., $Fe_{50}Co_{50}$ has a large effect of spin-dependent interfacial scattering to provide a high MR change rate. FeCo-series alloys having a bcc structure include $Fe_xCo_{100-x}$ (x=30 to 100) and $Fe_xCo_{100-x}$ with some additives. Among the FeCo-series alloys, $Fe_xCo_y$ (x=40-80, y=20-60) has overall characteristics and is easy to use.

When the upper magnetization fixed layer 143 includes a magnetic layer with a bcc structure suitable for a high MR change rate, the total film thickness of this magnetic layer is preferably 1.5 nm or more. The total film thickness is adjusted to stabilize a bcc structure. Most metallic materials have an fcc structure or an fct structure to be used for a spin valve film. Therefore, only the upper magnetization fixed layer 143 could have the bcc structure. For this reason, if the upper magnetization fixed layer 143 is too thin, it is difficult to stably maintain the bcc structure, thereby making it impossible to provide a high MR change rate.

Alternatively, a $(Co_xFe_{100-x})_{100-y}B_y$ alloy (x=0 to 100, y=0 to 30) may be employed for a material of the upper magnetization fixed layer 143. Employing an amorphous alloy such as $(Co_xFe_{100-x})_{100-y}B_y$ therefor allows it to reduce variations in characteristics of an MR element to be miniaturized. The variations are caused by crystalline grains of the miniaturized MR element, which are specific thereto.

A thinner upper magnetization fixed layer 143 is more preferable to provide a higher MR change rate, whereas a thicker one is more preferable to provide a higher pinning magnetic field. That is, there is a trade-off between the thinner and thicker upper magnetization fixed layers 143. A bcc FeCo-alloy layer with a thickness of 1.5 nm or more is preferable to stably maintain the bcc structure. An fcc FeCo alloy layer with a thickness of 1.5 nm or more is also preferable to provide a high MR change rate. On the other hand, in order to provide a high pinning magnetic field, the thickness of the upper magnetization fixed layer 143 is preferably 5 nm or less at most and is more preferably 4 nm or less. As mentioned above, a preferable thickness of the upper magnetization fixed layer 143 is not less than 1.5 nm and not more than 5 nm. A more preferable thickness thereof is not less than 2.0 nm and not more than 4 nm.

Instead of a magnetic material having a bcc structure, a $Co_{90}Fe_{10}$ alloy having an fcc structure, Co, and a Co alloy both having an hcp structure are employed for the upper magnetization fixed layer 143. The $Co_{90}Fe_{10}$ alloy is widely used for conventional magnetoresistive elements. For the upper magnetization fixed layer 143, the alloy including simple metals, such as Co, Fe, or Ni, or an alloy including at least one of these elements can be employed. An FeCo alloy having a bcc structure, a Co alloy having a Co composition of 50% or more, and a Ni alloy having a Ni composition of 50% or more are advantageous to the upper magnetization fixed layer 143 for a high MR change rate.

Alternatively, Heusler magnetic alloys, such as $Co_2MnGe$, $Co_2MnSi$, and $Co_2MnAl$, may be employed for the upper magnetization fixed layer 143.

The spacer layer 16 decouples the magnetic coupling between the magnetization fixed layer 14 and the magnetization free layer 18. In this embodiment, the oxide layer 21 is provided to the spacer layer 16. The oxide layer 21 can control up-spin electrons or down-spin electrons passing therethrough. This is called a spin filter effect. The oxide layer 21 includes at least one element selected from the group consisting of Zn, In, Sn, and Cd and at least one element selected from the group consisting of Fe, Co, and Ni. Specifically, a mixed oxide including $Fe_{50}Co_{50}$ and Zn can be employed for the oxide layer 21. Zn belongs to the same period as those of Fe, Co and Ni in a periodic table, and has, therefore, a tendency to be given ferromagnetism most easily among In, Sn, and Cd. Therefore, the tendency stably provides the oxide layer 21 with a spin-dependent scattering effect.

The oxide materials enable it to enhance spin-dependent scattering and to reduce spin-flip as a result of the low resistivity thereof, thereby enhancing an MR change rate of the magnetoresistive element 10.

The SF layer preferably includes oxides, e.g, ZnO, $In_2O_3$, $SnO_2$, ZnO, CdO, $CdIn_2O_4$, $Cd_2SnO_4$, $Zn_2SnO_4$, etc. based on Zn, In, Sn, and Cd to have a low resistivity. The following mechanism may provide these oxides with low resistivity. These oxide semiconductors have a band gap of 3 eV or more. A little reduction of these oxides makes the chemical compositions thereof deviate from stoichiometric compositions, thereby forming donor levels due to intrinsic defects such as oxygen vacancies. As a result, the density of conduction electrons reaches not less than $10^{18}$ $cm^{-3}$ and not more than $10^{19}$ $cm^{-3}$. A valence band of the oxides is formed dominantly of 2p-orbitals of oxygen atoms, and a conduction band thereof is formed dominantly of s-orbits of metal atoms. When the carrier density increases to be more than $10^{18}$ $cm^{-3}$, a Fermi level reaches the conduction band to degenerate. Such an oxide semiconductor is called an n-type degenerated semiconductor which has high-density conduction electrons with high mobility to provide a low resistivity. Alternatively, other oxides having a low resistivity may be employed even if the above-mentioned mechanism is not applied thereto as well.

In order to provide the SF layer with a high spin-dependent scattering performance, the SF layer preferably includes oxides of Co, Fe, and Ni, which exhibit magnetism at room temperature. Oxides including Zn, In, Sn, and Cd which are effective for a low resistivity exhibit no magnetism as a bulk property. When an ultra-thin oxide layer is inserted in a magnetization free layer or a magnetization fixed layer (a pinned layer), the intrinsically nonmagnetic ultra-thin oxide layer develops magnetism to provide a spin filter effect (see JPA2004-6589, for example). When the ultra-thin oxide layer includes the oxide of Co, Fe, or Ni, the ultra-thin oxide layer develops magnetism without a limit of the film thickness thereof more easily to provide a higher spin filter effect than an ultra-thin oxide layer without Co, Fe, or Ni.

Alternatively, some additive elements may be added to the oxide layer. When Al is added to a Zn oxide as one of the additive elements, it is reported that heat resistance of the Zn oxide is improved. In addition to Al, the additive elements include B, Ga, In, C, Si, Ge, and Sn. A mechanism to increase the heat resistance is not completely clarified. However, the following mechanism is considered. The Zn oxide is slightly reduced to create oxygen vacancies therein. The oxygen vacancies decrease as a result of thermal reoxidation thereof due to the Al addition. The decrease in the oxygen vacancies changes carrier density to enhance the heat resistance of the Zn oxide. The above-described elements are dopants of III group or IV group, and prevent the progressive thermal reoxidation of Zn atoms. The dopants control a variation in the carrier density or a resistivity change with heat. The dopant can reduce a variation in the carrier density or a resistivity change with heat.

The oxides of Fe, Co, and Ni have weaker magnetism than metallic Fe, Co, and Ni. When the oxides just including Fe, Co, and Ni are employed for a spacer layer, the oxide layer does not serve as a spacer layer. This is because the magnetization free layer and the magnetization fixed layer are strongly coupled magnetically with each other. On the other hand, when at least a nonmagnetic element selected from the group consisting of Zn, In, Sn, and Cd is added as an additive to the master metals, the oxide layer with the additive has lower magnetization than an oxide layer without the additive, or the oxide layer with the additive becomes nonmagnetic. Such an oxide layer with weak magnetism can decouple the magnetic coupling between the magnetization fixed layer 14 and the magnetization free layer 18 to serve as a spacer layer.

The magnetoresistive element 10 including the oxide layer 21 as the spacer layer 16 can provide an enhancement of the MR change rate thereof. The oxide layer 21 includes at least one element selected from the group consisting of Zn, In, Sn and Cd, and at least one element selected from the group consisting of Fe, Co, and Ni.

Figure 2:
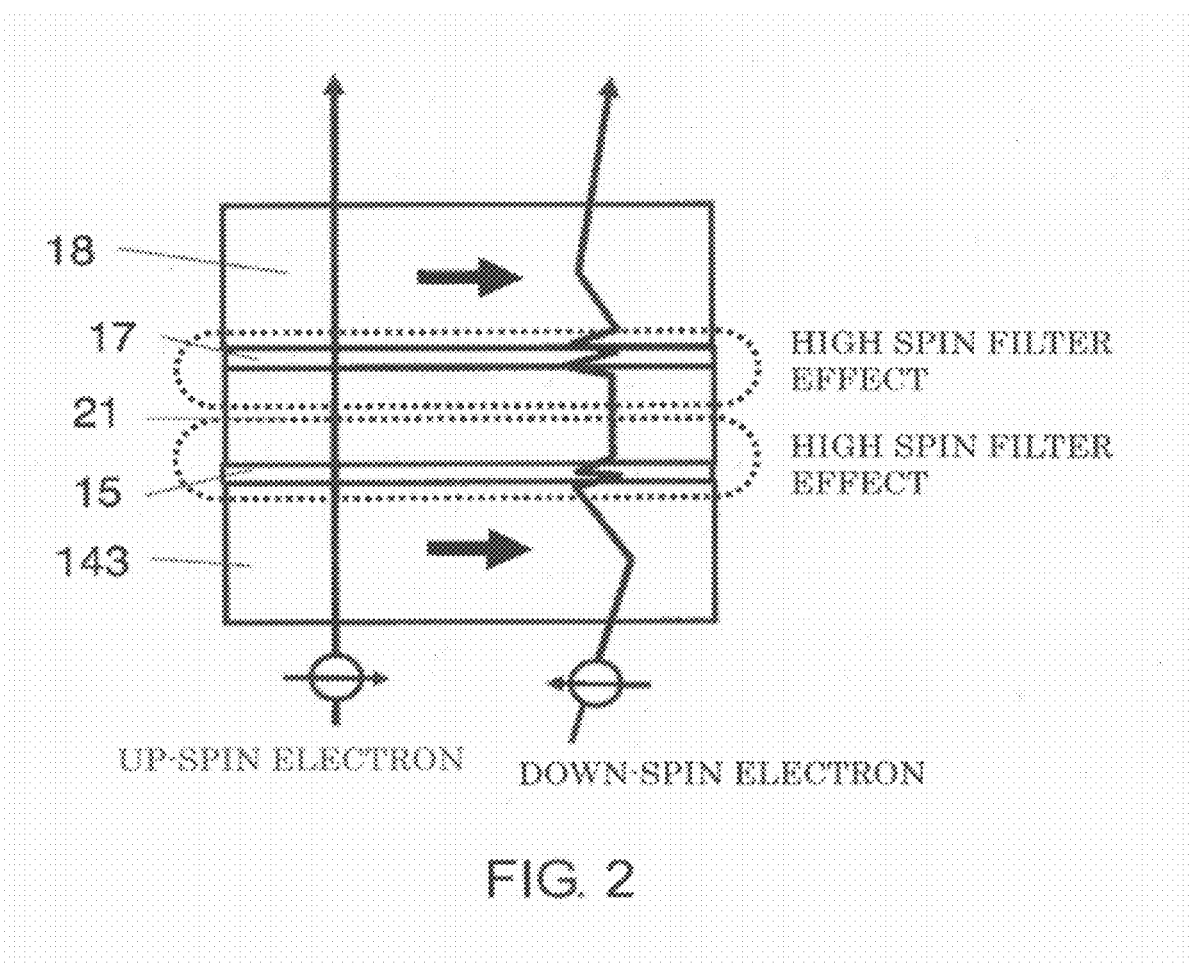
FIG. 2 is an enlarged view showing a spin-filter portion of the magnetoresistive element in accordance with the first embodiment.

Such an oxide layer 21 may be provided to a magnetization free layer or a magnetization fixed layer. When the oxide layer 21 is provided to the spacer layer, the magnetoresistive element has the following advantage. The oxide layer 21 is inserted between the magnetization free layer 18 and the upper magnetization fixed layer 143 as shown in FIG. 1. The spin-dependent scattering is enhanced by inserting the oxide layer 21 as shown in FIG. 2. The enhancement of the spin-dependent scattering takes place at the interface between the magnetization free layer 18 and the oxide layer 21, and at the interface between the upper magnetization fixed layer 143 and the oxide layer 21. The spin-dependent scattering is enhanced by both the magnetization free layer 18 and the upper magnetization fixed layer 143, thereby providing a higher MR change rate than the spin-dependent scattering to be enhanced by either one of the magnetization free layer 18 and the upper magnetization fixed layer 143. Providing the oxide layer to each of the insides of the magnetization free layer 18 and the upper magnetization fixed layer 143 also enhances the spin-dependent scattering in both the magnetization free layer 18 and the upper magnetization fixed layer 143. However, in such a case with the two oxide layers inserted, both the two oxide layers increase a probability of the spin-dependent scattering therein. This makes it difficult to sufficiently enhance an MR change rate. On the other hand, providing the spacer layer with a single oxide layer does not causes an increase in a probability of spin-flip but provide an increase in the spin-dependent scattering in both the magnetization free layer 18 and the upper magnetization fixed layer 143. This results in a high MR change rate.

Inserting the oxide layer in the spacer layer has another advantage. In the CPP-GMR elements in accordance with the embodiments, scattering probabilities for up-spin electrons and down-spin electrons in the magnetization free layer 18 are different from the probabilities therefor in the upper magnetization fixed layer 143. This provides a MR phenomenon. A diffusion-type MR phenomenon in a CPP-GMR element characteristically reduces an MR change rate thereof when the respective areal resistances $RA_{free}$ and $RA_{pin}$ of the magnetization fixed layer and the magnetization free layer differ greatly from each other. This is called a resistance mismatch between the magnetization fixed layer and the magnetization free layer. When an oxide layer is inserted in either one of the two layers, i.e., the magnetization free layer and the magnetization fixed layer, the oxide layer causes the resistance mismatch so that only one of the two has a larger areal resistance. This does not provide a sufficiently high MR change rate. On the other hand, an oxide layer inserted in the spacer layer increases the areal resistances at the interface between the oxide layer and the magnetization free layer, and at the interface between the magnetization fixed layer and the oxide layer. This does not cause the resistance mismatch and enhances an MR change rate sufficiently.

Figure 3:
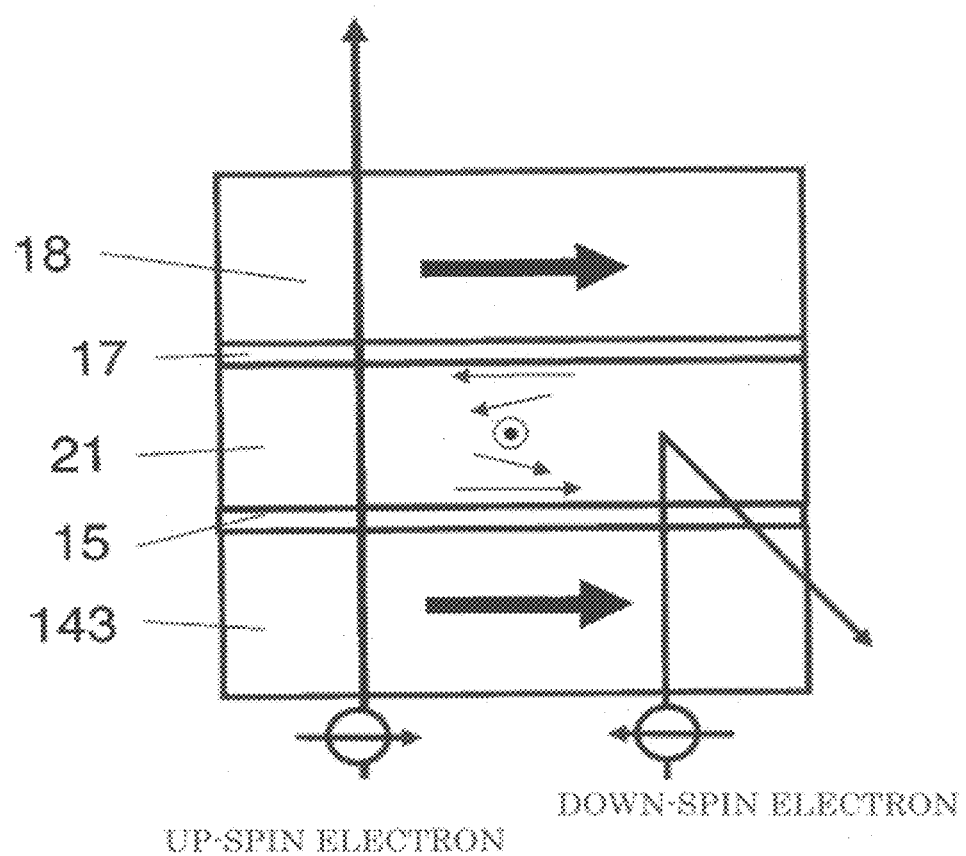
FIG. 3 is a view showing a twisted magnetic structure where magnetization is twisted in an oxide layer.

Inserting the oxide layer in the spacer layer has a further advantage. The mixed oxide layer in accordance with the embodiments includes at least one element selected from the group consisting of Zn, In, Sn, and Cd, and at least one element selected from the group consisting of Fe, Co, and Ni. This mixed oxide layer has weak ferromagnetism depending on its composition. When the mixed oxide layer has such weak magnetism, a portion of the mixed oxide layer on the side of the magnetization fixed layer is magnetically coupled with the magnetization fixed layer, whereas a portion of the mixed oxide layer on the side of the magnetization free layer is magnetically coupled with the magnetization free layer. As a result, when the magnetization directions of the magnetization free layer 18 and the upper magnetization fixed layer 143 are anti-parallel to each other, a magnetic domain wall is formed in the oxide layer 21 as being a twisted magnetic structure as shown in FIG. 3. When electrons pass through such a twisted magnetic structure, the electrons undergo spin-dependent scattering strongly to provide a high MR change rate.

The oxide layer is preferably homogenous to sufficiently provide an SF effect. Accordingly, the film thickness of the oxide layer 21 is preferably 0.5 nm or more. On the other hand, the upper limit of the film thickness thereof is 4 nm or less to provide a narrow read gap (a distance between shield electrodes sandwiching in the CPP-GMR element therebetween).

In FIG. 1, the metal layers 31 and 32 are arranged on the upper and lower sides of the oxide layer 21 as spacer layers 16. Cu, Ag, Au, and Zn can be employed for the metal layers 31 and 32, for example. The metal layers 31 and 32 do not disturb the enhancement of spin-dependent scattering as a result of the high spin-dependent scattering at the interface between a magnetic layer and the metal layers of these elements. The magnetic layer means the magnetization fixed layer or the magnetization free layer. The enhancement of the spin-dependent scattering is due to the oxide layer. Alternatively, Ru, Rh, Re, Ir, and Os may be employed as the metal layers 31 and 32.

The film thicknesses of the metal layers 31 and 32 are preferably 2 nm or less, and are more preferably 1 nm or less. The film thicknesses are to extract sufficient spin accumulation from the magnetization fixed layer 143 or the magnetization free layer 18 for the oxide layer 21.

The magnetization free layer 18 includes a ferromagnetic substance of which magnetization direction changes with an external magnetic field. For example, a CoFe layer can be formed on a FeNi layer to provide a double layer of $Co_{90}Fe_{10}$[1 nm]/$Ni_{83}Fe_{17}$[3.5 nm] for the magnetization free layer 18. Alternatively, a single layer of $Co_{90}Fe_{10}$[4 nm] may be employed for the magnetization free layer 18 without a NiFe layer. Alternatively, a trilayer including CoFe/NiFe/CoFe may be employed for the magnetization free layer 18.

Among CoFe-series alloys, a $Co_{90}Fe_{10}$ alloy is preferable for the magnetization free layer 18 as having a stable soft magnetic characteristic. A CoFe layer having a composition near that of $Co_{90}Fe_{10}$ preferably has a film thickness of not less than 0.5 nm and not more than 4 nm. Alternatively, $Co_xFe_{100-x}$ (x=70 to 90) may be employed.

Alternatively, a multilayer with CoFe layers and ultra-thin Cu layers laminated plurally alternately, or a multilayer with Fe layers and ultra-thin Cu layers laminated plurally alternately may be employed for the magnetization free layer 18. The film thicknesses of the CoFe layers are not less than 1 nm and not more than 2 nm. The film thicknesses of the Cu layers are not less than 0.1 nm and not more than 0.8 nm.

Alternatively, an amorphous magnetic layer, e.g., a CoZrNb layer may be employed as a portion of the magnetization free layer 18. Even when employing such an amorphous magnetic layer therefor, the side of the amorphous magnetic layer in contact with the spacer layer 16 is needed to be crystalline. The side thereof in contact with the spacer layer 16 is influential to the MR change rate. As a structure of the magnetization free layer 18, the following is employed when viewing the magnetization free layer 18 from the spacer layer 16. That is, examples of the structure include (1) single crystalline layer (2) lamination of crystalline layer/amorphous layer, (3) lamination of crystalline layer/amorphous layer/crystalline layer. In all the examples (1) to (3), it is important that a crystalline layer is in contact with both the spacer layer 16 and the magnetization free layer 18.

The cap layer 19 serves as a protection layer to protect the spin valve film. The cap layer 19 can include two or more metallic layers, e.g., a double-layer of Cu [1 nm]/Ru[10 nm]. Alternatively, the cap layer may include a Ru/Cu layer of which Ru layer is disposed on the side of the free layer 18. The film thickness of the Ru layer is preferably not less than 0.5 nm and not more than 2 nm. The cap layer having such a structure is preferable particularly for the magnetization free layer 18 including a NiFe layer. Ru does not form solid solution with Ni, thereby reducing magnetostriction of an interdiffusion layer to be formed between the magnetization free layer 18 and the cap layer 19.

When the cap layer 19 includes Cu/Ru or Ru/Cu, the film thickness of the Cu layer can be not less than 0.5 nm and not more than 10 nm, whereas the film thickness of the Ru layer can be not less than 0.5 nm and not more than 5 nm. Ru layers have so high a resistivity that too thick Ru layers are not preferable, thereby confining the film thicknesses of the Ru layers to such a range of the film thickness.

Alternatively, other metal layers may be employed for the cap layer 19 instead of the Cu layer or the Ru layer. A structure of the cap layer 19 is not limited and other materials may be employed therefor, as long as the cap layer including the other materials can protect the spin valve film. However, the materials of the cap layer 19 could affect the MR change rate and long-term reliability of the spin valve film. Cu and Ru are preferable examples of the material for the cap layer regarding the MR change rate and the long-term reliability.

Modification

How to insert the oxide layer 21 is not limited to the embodiment shown in FIG. 1 where the oxide layer 21 is sandwiched between the first and second metal layers. For example, the oxide layer 21 can be inserted in various layers as shown in FIGS. 5 to 8. Each modification will be described below.

First Modification

Figure 5:
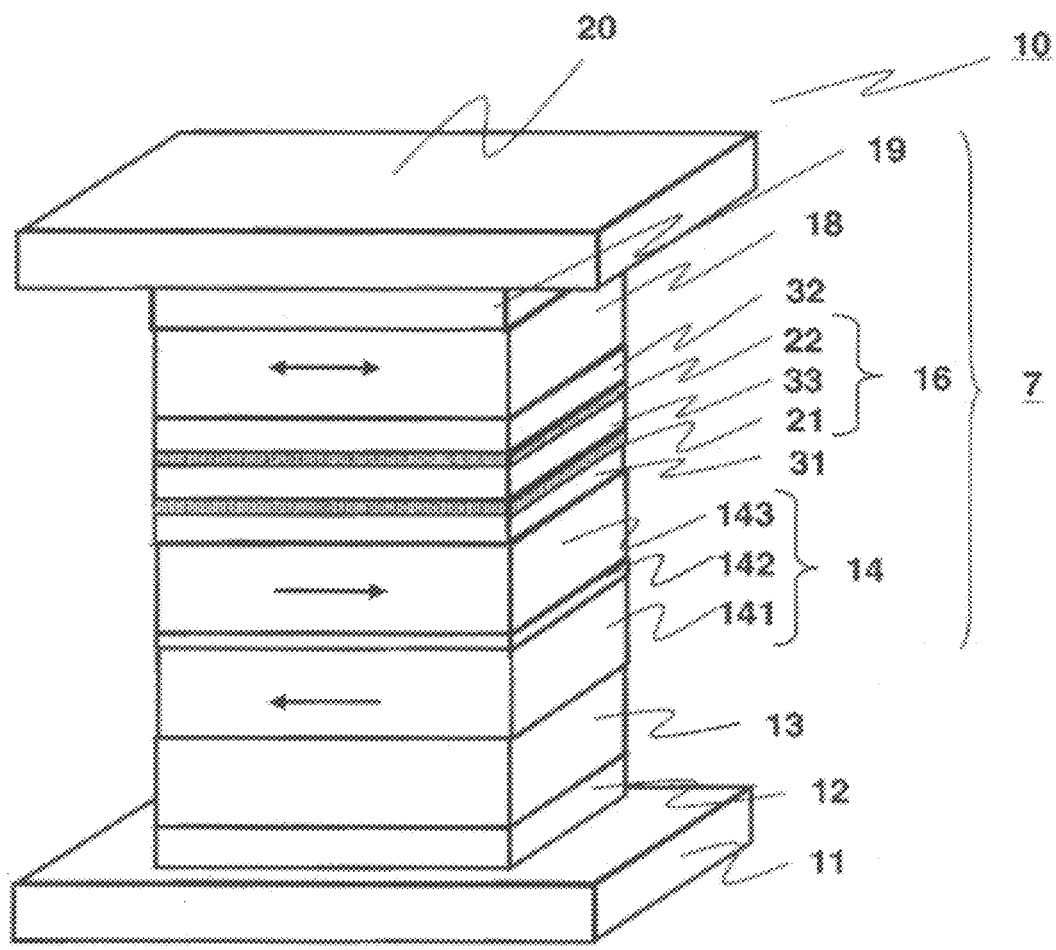
FIG. 5 is a view showing a first modification of the magnetoresistive element in accordance with the first embodiment.

FIG. 5 is a view showing a first modification of the magnetoresistive element 10 in accordance with the first embodiment. Wherever possible, the same reference numerals will be used to denote the same or like parts as those in the first embodiment shown in FIG. 1. The same description will not be repeated.

The first modification differs from the first embodiment in that two oxide layers 21 are formed in a spacer layer.

Inserting the two oxide layers 21 in the spacer layer also provides a high spin filter effect, thereby enhancing an MR change rate greatly.

Second Modification

Figure 6:
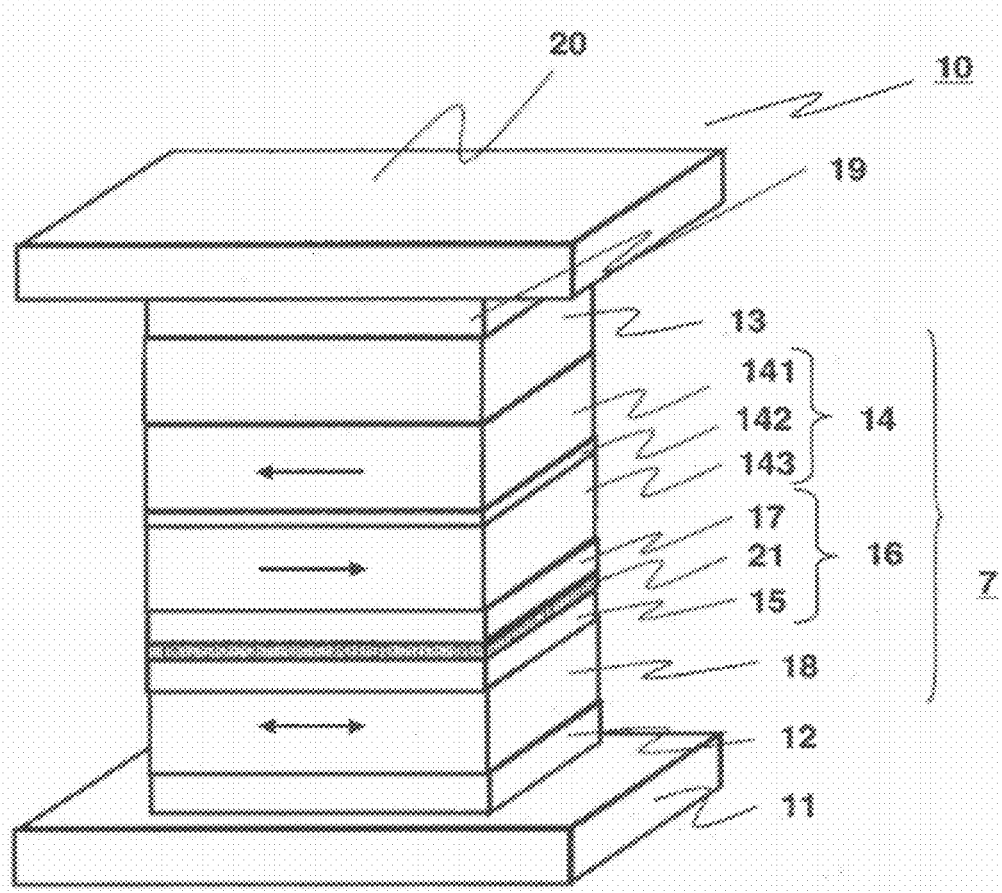
FIG. 6 is a view showing a second modification of the magnetoresistive element in accordance with the first embodiment.

FIG. 6 is a view showing a second modification of the magnetoresistive element 10 in accordance with the first embodiment. Wherever possible, the same reference numerals will be used to denote the same or like parts as those in the first embodiment shown in FIG. 1. The same explanation will not be repeated.

The second modification differs from the first embodiment in that the magnetization fixed layer 14 is disposed above the magnetization free layer 18. That is, the second modification employs a top spin-valve type structure.

Such a top spin-valve type structure also provides a high spin filter effect, thereby enhancing an MR change rate greatly.

Third Modification

Figure 7:
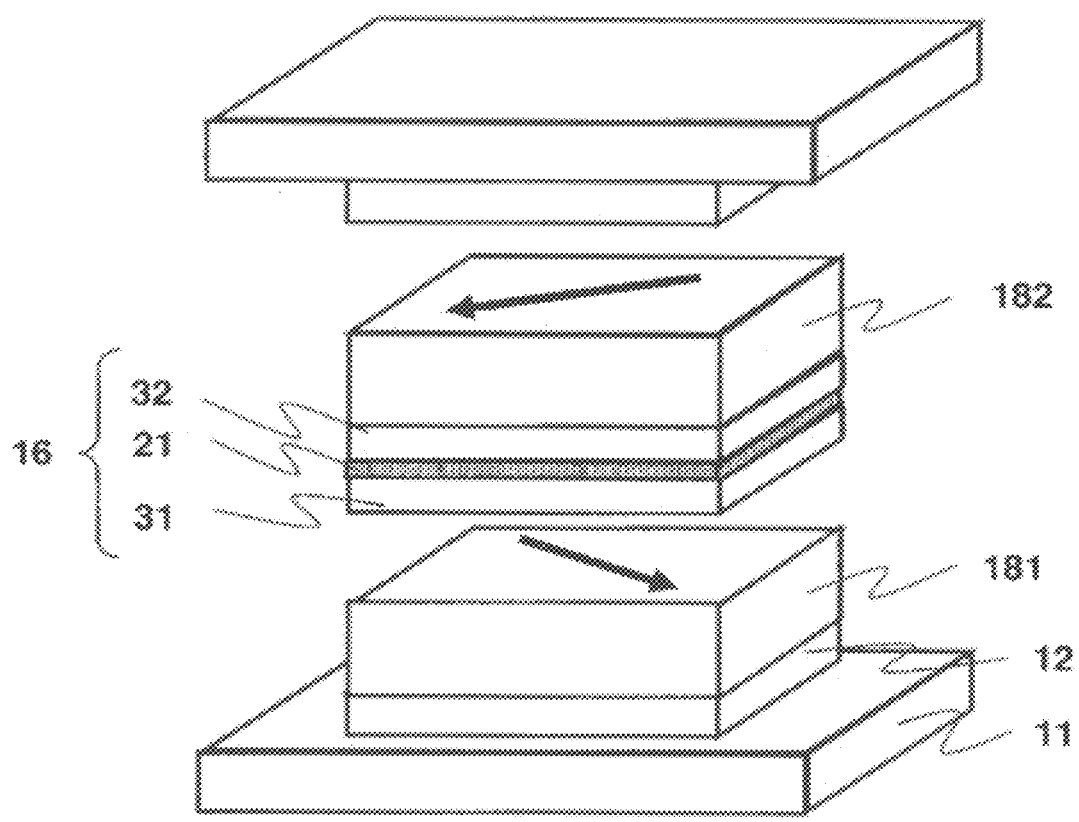
FIG. 7 is a view showing a third modification of the magnetoresistive element in accordance with the first embodiment.

FIG. 7 is a view showing a third modification of the magnetoresistive element 10 in accordance with the first embodiment. Wherever possible, the same reference numerals will be used to denote the same or like parts as those in the first embodiment shown in FIG. 1. The same description will not be repeated.

The third modification differs from the first embodiment in that two magnetization free layers are formed without a magnetization fixed layer. Such a magnetoresistive element has two magnetization free layers 181 and 182 biased so that the magnetization directions thereof make an angle of 90° with each other under no external magnetic field from a magnetic disk. The external magnetic field from the magnetic disk changes the relative angle between the magnetization directions of the two magnetization free layers. This allows it to employ the magnetoresistive element for a reproducing head. Such a magnetization alignment to make an angle of 90° is enabled by magnetic coupling via the spacer layer or a hard bias.

Here, the oxide layer is disposed inside the spacer layer.

Such a magnetoresistive element having the two magnetization free layers also provides a high spin filter effect, thereby enhancing an MR change rate greatly.

Fourth Modification

Figure 9:
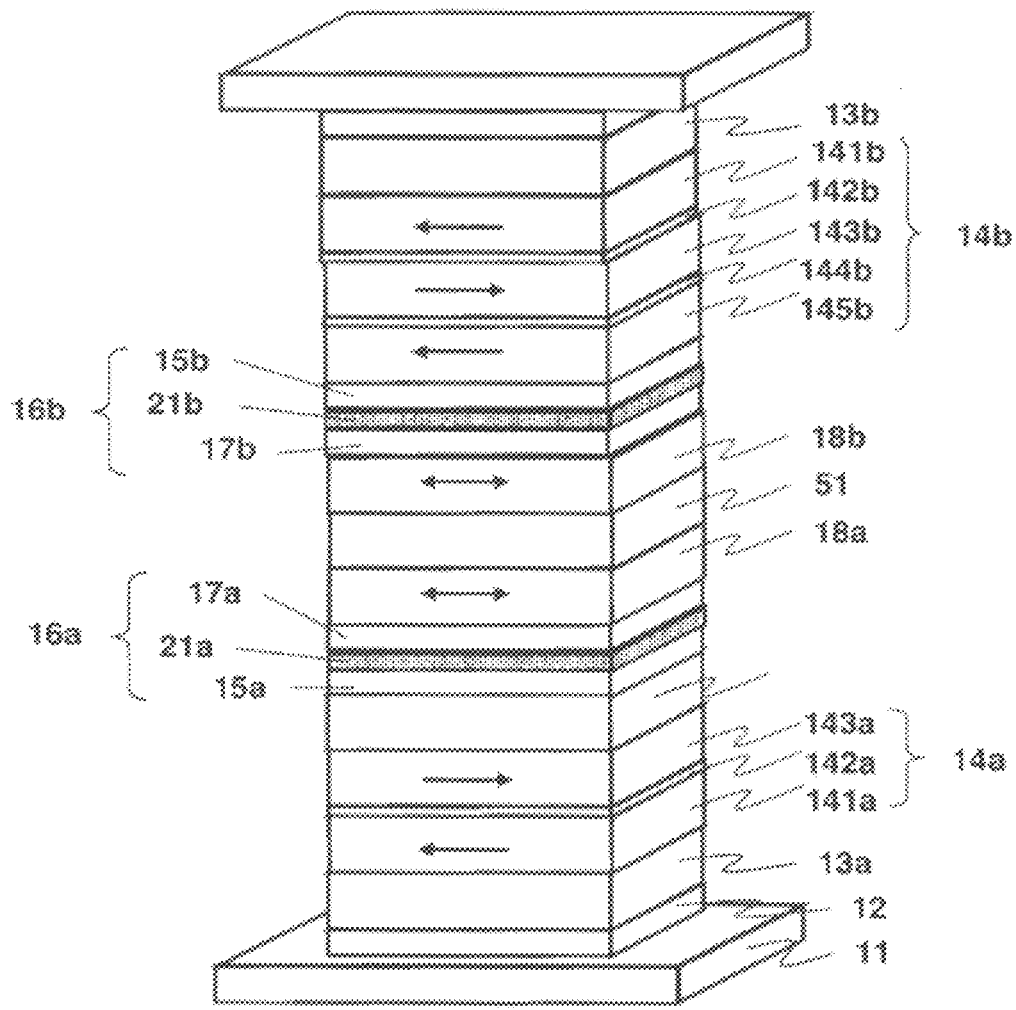
FIG. 9 is a view showing a fifth modification of the magnetoresistive element in accordance with the first embodiment.

FIG. 9 is a view showing a fourth modification of the magnetoresistive element 10 in accordance with the first embodiment.

The fourth modification differs from the first embodiment in that the fourth modification has a differential type structure including two series-connected magnetoresistive elements. One of the two magnetoresistive elements has a magnetization fixed layer of which magnetization is fixed in a direction opposite to the magnetization direction of the magnetization fixed layer of the other of the two. In the fourth embodiment, the two series-connected magnetoresistive elements generate resistance changes with the respective reverse polarities to an external magnetic field. In case that the two series-connected magnetoresistive elements include a perpendicular magnetization film as a recording layer, a transition region therebetween provides an output. In the transition region, upward magnetization and downward magnetization are adjacent to each other. That is, the fourth embodiment enables it to differentially detect a magnetic field from a magnetic recording medium. Here, nonmagnetic metals are employed for an intermediate layer 51. The nonmagnetic metals include Au, Ag, Ru, Ir, Os, Re, Rh, and Ta. Alternatively, the intermediate layer 51 may include a laminated structure where a nonmagnetic metal layer is sandwiched between two magnetic layers to generate antiferromagnetic coupling. The nonmagnetic metal may include one element selected from the group consisting of Ru, Ir, Os, Re, and Rh. The respective magnetic layers may include elements selected from the group consisting of Co, Fe, and Ni. In the latter case, the magnetization directions of two magnetization free layers 18$a$ and 18$b$ can be anti-parallel.

A manufacturing method of the magnetoresistive element 10 in accordance with the first embodiment will be described below. The manufacturing method includes various film formation methods to form each layer of the magnetoresistive element 10. The film formation methods include methods of DC-magnetron sputtering, RF-magnetron sputtering, ion-beam sputtering, vapor-deposition, CVD (Chemical Vapor Deposition), and MBE (Molecular Beam Epitaxy).

Figure 10:
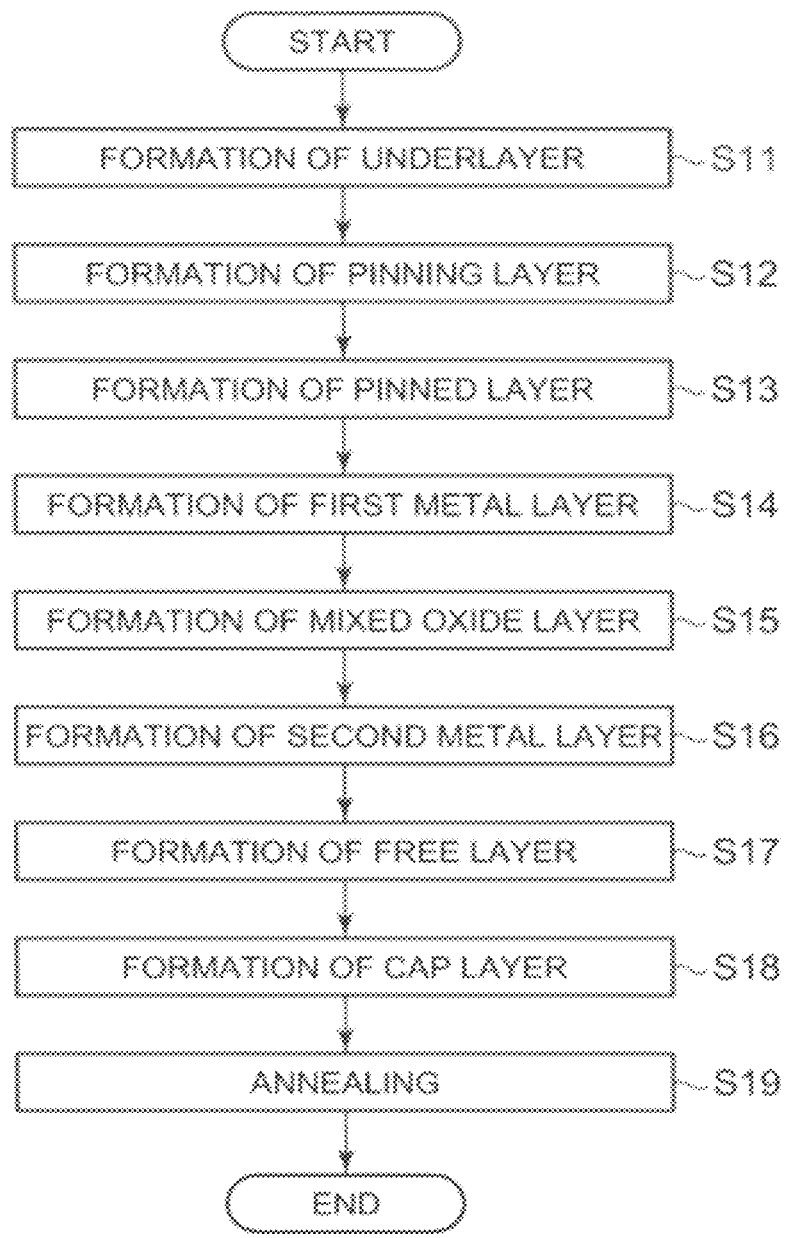
FIG. 10 is a flow chart to partially show a manufacturing process of the magnetoresistive element in accordance with the first embodiment.

FIG. 10 is a flow chart to partially show the manufacturing process of the magnetoresistive element in accordance with the first embodiment.

At S11, the electrode 11 is beforehand formed on a substrate (not shown) with a microfabrication process. Next, the underlayer 12, e.g., Ta[1 nm]/Ru[2 nm] is formed on the electrode 11. The Ta layer corresponds to a buffer layer 12$a$ to prevent the lower electrode 11 from having a rough surface. The Ru layer corresponds to a seed layer 12$b$ to control crystalline orientation and grain size of the spin valve film included in the magnetoresistive element 10.

At S12, the pinning layer 13 is formed on the underlayer 12. Materials for the pinning layer 13 include IrMn, PtMn, PdPtMn, and RuRhMn, all of which are antiferromagnetic.

At S13, the magnetization fixed layer 14 is formed on the pinning layer 13. The magnetization fixed layer 14 can include a synthetic magnetization fixed layer consisting of a lower magnetization fixed layer 141 ($Co_{75}Fe_{25}$[4.4 nm]), a magnetic coupling layer 142 (Ru), and an upper magnetization fixed layer 143 ($Fe_{50}Co_{50}$[4 nm]).

At S14, a first metal layer is formed on the magnetization fixed layer 14.

The first metal layer is formed employing Au, Ag, Cu, Zn, etc.

At S15, an oxide layer is formed on the spacer layer 16. As an example, a metal layer including Fe and Zn is formed on the spacer layer 16. Here, the metal layer including Fe and Zn may be a lamination structure, e.g., Fe/Zn, Zn/Fe, (Fe/Zn)×2, and a single alloy layer such as $Zn_{50}Fe_{50}$. Here, a master material of the oxide layer may be a metal layer including at least one element selected from the group consisting of Zn, In, Sn and at least one element selected from the group consisting of Fe, Co, and Ni. Next, the metal layer including Zn and Fe is oxidized. The oxidization of the metal layer employs so called "ion assisted oxidization (IAO)". IAO is an oxidizing method which irradiates metals with an ion beam or plasma of noble gases, such as Ar, Xe, He, Ne, Kr, and so on, while gassing oxygen. Alternatively, pure oxygen may be used for the ion beam or plasma without using noble gases. The energy-assist due to the ion-beam irradiation for the oxidation of the metal layer can provide a stable and homogeneous oxide layer. Alternatively, forming a metal layer and oxidizing the metal layer may be repeated several times to form an entire oxide layer. In this case, an entire oxide layer having a prescribed thickness is not form with a one-time film-formation followed by one-time oxidation. Instead of the one-time film-formation and oxidation, the entire oxide layer is preferably formed in several divided thicknesses by oxidizing thin divided metal layers. Alternatively, the metal layer including Zn and Fe may undergo natural oxidation. However, the energy-assist oxidation is more preferable than the natural oxidation to provide a stable oxide. When the multilayer of Zn and Fe is employed for a master material of the oxide layer, oxidation with ion-beam irradiation is preferable to provide a homogeneously mixed oxide layer including Zn and Fe. Alternatively, the homogeneously mixed oxide layer may be provided by sputtering using an oxide target of $(Zn_{30}Fe_{70})_3O_4$. Furthermore, the mixed oxide layer provided by sputtering the $(Zn_{30}Fe_{70})_3O_4$ target may undergo additional oxidation or additional reduction. The additional oxidation allows it to control the oxygen composition of the Fe—Zn mixed oxide layer so that the mixed oxide layer provides a highest spin filter effect.

When employing ion beams or plasma of noble gases, the gases may include at least one selected from the group consisting of Ar, Xe, He, Ne, and Kr.

Alternatively, heating treatment may be applied in addition to the ion-beam irradiation as energy assist. The heating treatment may be performed by annealing the metal layer at temperatures ranging from 100° C. to 300° C. with gassing oxygen.

A beam condition for the ion-beam assist oxidation will be described below to provide the oxide layer 21. When the oxide layer 21 is formed with the ion-beam or plasma assist oxidation, it is preferable to set up an acceleration voltage V of 30V to 130V and a beam current Ib of 20 mA to 200 mA therefor. These acceleration voltage V and beam current Ib provide the energy-assist oxidation with a much lower etching effect than a condition for routine ion-beam etching. It is also possible to form the oxide layer using RF plasma instead of the ion beam. An incident angle of the ion beam may be appropriately changed in a range of 0° to 80°. The incident angle is defined as 0° when the beam is incident perpendicularly onto the metal layer, whereas the incident angle is defined as 90° when the beam is incident parallel to the metal layer. The processing time of the ion-beam oxidation preferably ranges from 15 sec to 1200 sec and is more preferably 30 sec or longer for the controllability. If the processing time is too long, the productivity of the magnetoresistive elements lowers. This will be undesirable. From the controllability and productivity, the processing time of the ion-beam oxidation preferably ranges from 30 sec to 600 sec.

In the ion-beam or plasma assist oxidation, an oxygen amount of exposure preferably ranges from $1\times10^3$ L to $1\times10^4$ L ("L" is Langmiur, 1 L=1×10$^{-6}$ Torr×sec) for IOA. The oxygen amount of exposure preferably ranges from 3×10$^3$ L to 3×10$^4$ L for the natural oxidation.

The oxidation of the metal including Zn and Fe may be followed by a reduction using a reducing gas. The reducing gas include at least any of ions, plasma and radicals of argon, helium, neon, krypton, xenon, or any of molecules, ions, plasma and radicals of hydrogen. The gas including at least any one of ions and plasma of argon, helium, neon, krypton, or xenon is preferably employed as a reducing gas. Or the gas including at least any one of ions and plasma of hydrogen or nitrogen is also preferably employed thereas. Furthermore, a gas including at least any one of ions and plasma of argon is more preferably employed as a reducing gas. The reduction processing allows it to control the oxygen composition of the post-oxidation layer including the master material so that the post-oxidation layer produces a highest spin filter effect.

The reduction processing can be performed by heating the post-oxidation layer including the master material. For example, the heating of the post-oxidation layer can be performed at temperatures of 100° C. to 300° C. as reduction processing. The heating provides more efficient reduction processing. Water-removal processing can be further applied to the post-reduction layer. The water-removal processing includes at least one step selected from the group consisting of argon-ion irradiation, argon-plasma irradiation, and heating. The water-removal processing removes moisture involved in the reduction.

Moreover, the termination of the above-mentioned process may be followed by the repetition of the oxidation and reduction processing. The removal processing of the reduction-involved moisture and the reduction processing are alternately repeated to provide a more efficient reduction.

Beam conditions for such reduction processing with Ar ion-beam irradiation will be described below. When the oxide layer is formed with the ion-beam or plasma assist oxidation, it is preferable to set up an acceleration voltage V of 30V to 130V and a beam current Ib of 20 mA to 200 mA therefor. The acceleration voltage V and beam current Ib provide the energy-assist oxidation with a much lower etching effect than a condition of routine ion-beam etching. It is also possible to form the oxide layer using RF plasma instead of the ion beam. An incident angle of the ion beam may be appropriately changed in a range of 0° to 80°. The incident angle is defined as 0° when the beam is incident perpendicularly onto the metal layer, whereas the incident angle is defined as 90° when the beam is incident parallel to the metal layer. The processing time of the ion-beam oxidation preferably ranges from 15 sec to 1200 sec and is more preferably 30 sec or longer for the controllability. If the processing time is too long, the productivity of the magnetoresistive elements lowers. This will be undesirable. From the controllability and productivity, the processing time of the ion-beam oxidation preferably ranges from 30 sec to 600 sec.

At S16, a second metal layer is formed on the oxide layer 21.

The second metal layer is formed employing Au, Ag, Cu, Zn, etc.

At S17, the magnetization free layer 18 is formed on the second metal layer. For example, a doublelayer Fe$_{50}$Co$_{50}$[1 nm]/Ni$_{90}$Fe$_{10}$[3 nm] is formed for the magnetization free layer 18.

At S18, the cap layer 19 is formed on the magnetization free layer 18. For example, a double layer Cu[1 nm]/Ru[10 nm] is formed for the cap layer 19.

At S19, annealing is performed.

Finally, the electrode 20 is formed on the cap layer 19 to perpendicularly pass a current through the magnetoresistive element 10.

Second Embodiment

Figure 4:
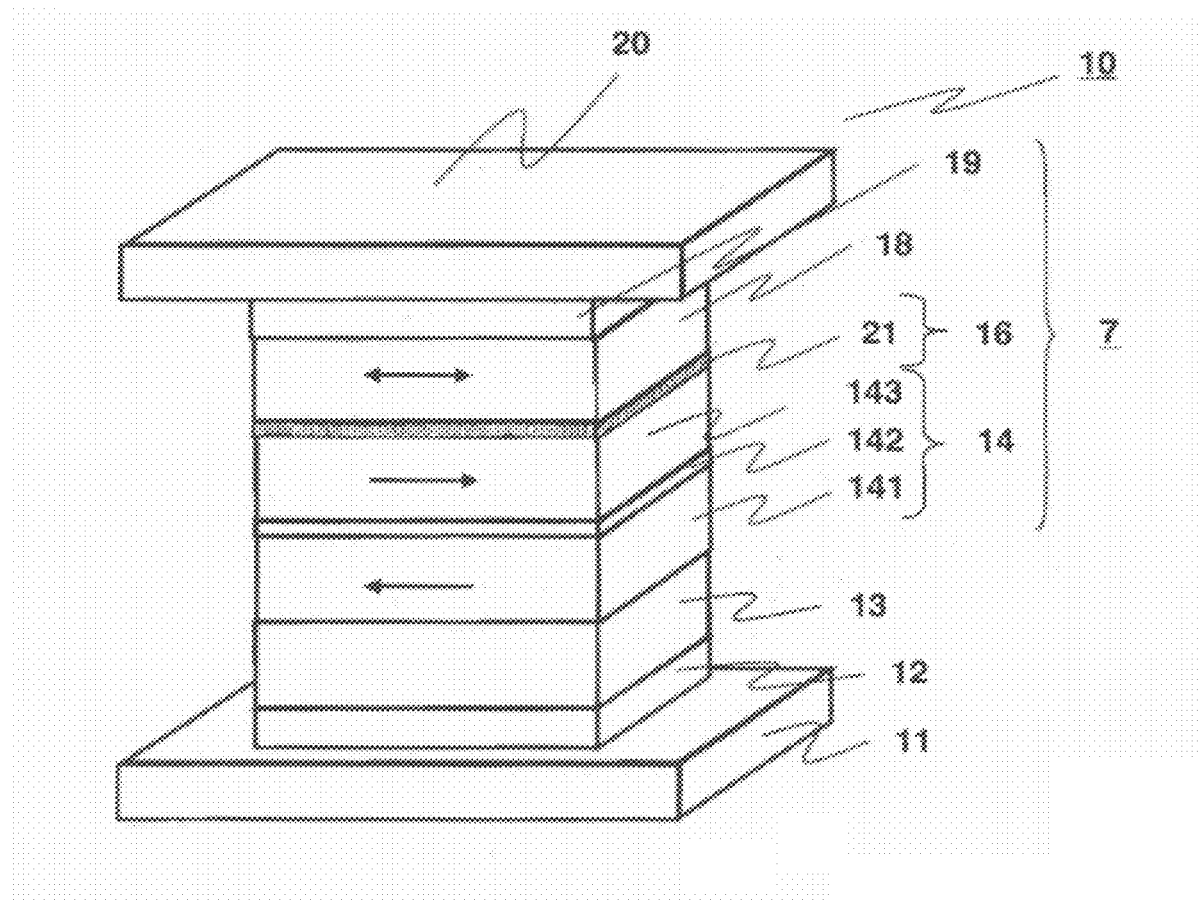
FIG. 4 is a view showing a configuration of a magnetoresistive element in accordance with a second embodiment.

FIG. 4 is a view showing a configuration of a magnetoresistive element 10 in accordance with a second embodiment.

The magnetoresistive element 10 in accordance with the second embodiment is provided with a lamination body 7, a pair of electrodes 11, 20, a pinning layer 13, and an underlayer 12.

The lamination body 7 includes the followings:

a cap layer 19 to protect the magnetoresistive element 10 from degradation, e.g., oxidation;

a magnetization fixed layer (a pinned layer) 14 of which magnetization is fixed (pinned);

a magnetization free layer 18 having magnetization to be freely rotatable and being provided between the cap layer 19 and the magnetization fixed layer 14;

an intermediate layer (referred to as a spacer layer 16 below) being provided between the magnetization fixed layer 14 and the magnetization free layer 18; and an oxide layer 21 being provided in the spacer layer 16 and including at least one element selected from the group consisting of Zn, In, Sn and at least one element selected from the group consisting of Fe, Co, and Ni.

The pinning layer 13 includes an antiferromagnetic body to fix a magnetization direction of the magnetization fixed layer 14 and is provided between the magnetization fixed layer 14 and the electrode 11. The underlayer 12 is provided between the pinning layer 13 and the electrode 11. The second embodiment differs from the first embodiment in that the spacer layer 16 does not include the lower and upper metal layers 15, 17.

The magnetoresistive element 10 in accordance with the second embodiment was prepared and evaluated for a RA value and an MR change rate. The spacer layer 16 was provided with the oxide layer 21 in the same way as in FIG. 2.

The underlayer 12 is Ta[1 nm]/Ru[2 nm];

the pinning Layer 13 is Ir$_{22}$Mn$_{78}$[7 nm];

the magnetization fixed layer 14 is Co$_{90}$Fe$_{10}$[4.4 nm]/Ru[0.9 nm]/Fe$_{50}$Ce$_{50}$[4 nm]; the oxide Layer 21 is Zn—Fe—O[1.5 nm]; and the magnetization free layer 18 is Fe$_{50}$Co$_{50}$[3 nm]. It was shown that the magnetoresistive element 10 in accordance with the second embodiment had an RA value of 0.2Ωμm$^2$ and an MR change rate of 14% both were higher than those of the comparative example 1 (to be listed in Tables below). A magnetoresistive element 10 in accordance with a first modification also provides an enhancement of the MR change rate in the same way as in the first embodiment. The enhancement of the MR change rate is considered to be based on the following mechanism. The oxide layer enhances spin-dependent scattering and reduces spin-flip as a result of the low resistivity thereof to provide a high spin filter effect.

A magnetoresistive element of an example 1 to be referred below is provided with first and second metal layers. On the contrary, a magnetoresistive element of an example 28 to be referred below is provided with no metal layer. Both the magnetoresistive elements of the examples 1 and 28 were evaluated for an interlayer-coupling magnetic field, yielding 45 Oe and 95 Oe, respectively. This result shows the following fact. An entire spacer layer formed of oxide layers provides a high MR change rate, whereas the spacer layer with the first and second metal layers attenuates the interlayer coupling between the magnetization free layer and the magnetization fixed layer to preferably reduce a magnetic noise.

Fifth Modification

Figure 8:
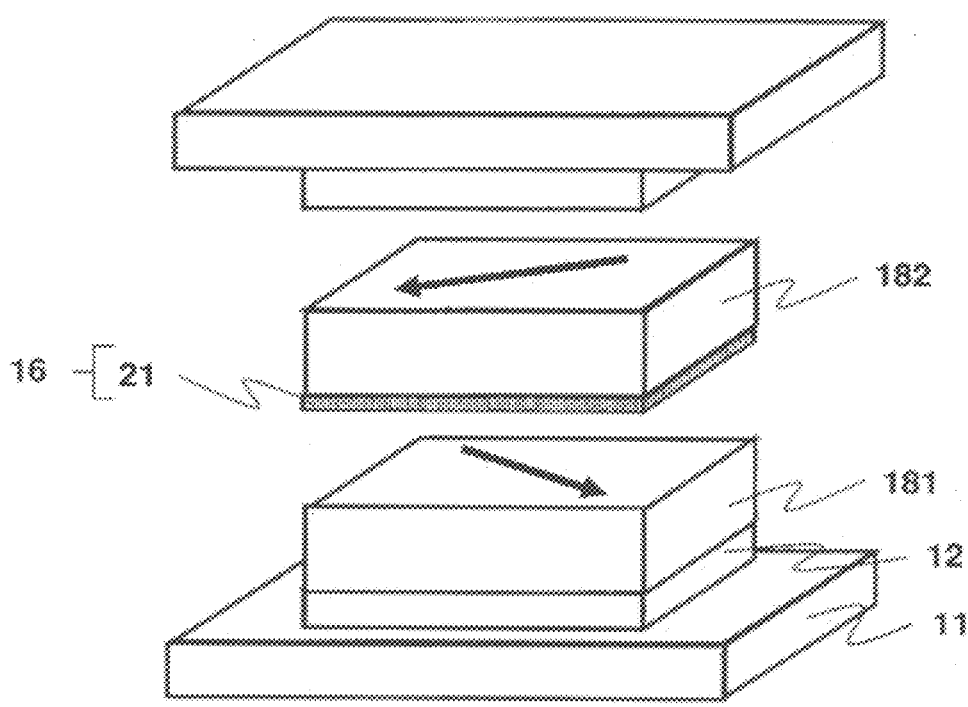
FIG. 8 is a view showing a fourth modification of the magnetoresistive element in accordance with the first embodiment.

FIG. 8 is a view showing a fifth modification of the magnetoresistive element 10 in accordance with the second embodiment. The same reference numerals will be used to denote the same or like parts as those in the second embodiment shown in FIG. 1. The same description will not be repeated.

The fifth modification differs from the second embodiment in that two magnetization free layers are formed without a magnetization fixed layer. Such a magnetoresistive element has two magnetization free layers 181 and 182 biased so that the magnetization directions thereof make an angle of 90° with each other under no external magnetic field from a magnetic disk. The external magnetic field from the magnetic disk changes the relative angle between the magnetization directions of the two magnetization free layers. This allows it to employ the magnetoresistive element for a reproducing head. Such a magnetization alignment to make an angle of 90° is enabled by magnetic coupling via the spacer layer or a hard bias.

The entire spacer layer is formed of the oxide layer 21.

Such a magnetoresistive element having the two magnetization free layers also provides a high spin filter effect, thereby enhancing an MR change rate greatly.

Alternatively, the second embodiment may employ a top spin valve structure in addition to the above-mentioned fifth modification in the same way as in the second modification of the first embodiment.

Alternatively, a differential structure may be employed for the second embodiment in the same way as in the second modification of the first embodiment.

Third Embodiment

Next, a magnetic recording/reproducing apparatus and magnetic head assembly using the magnetoresistive element 10 will be described below.

Figure 12:
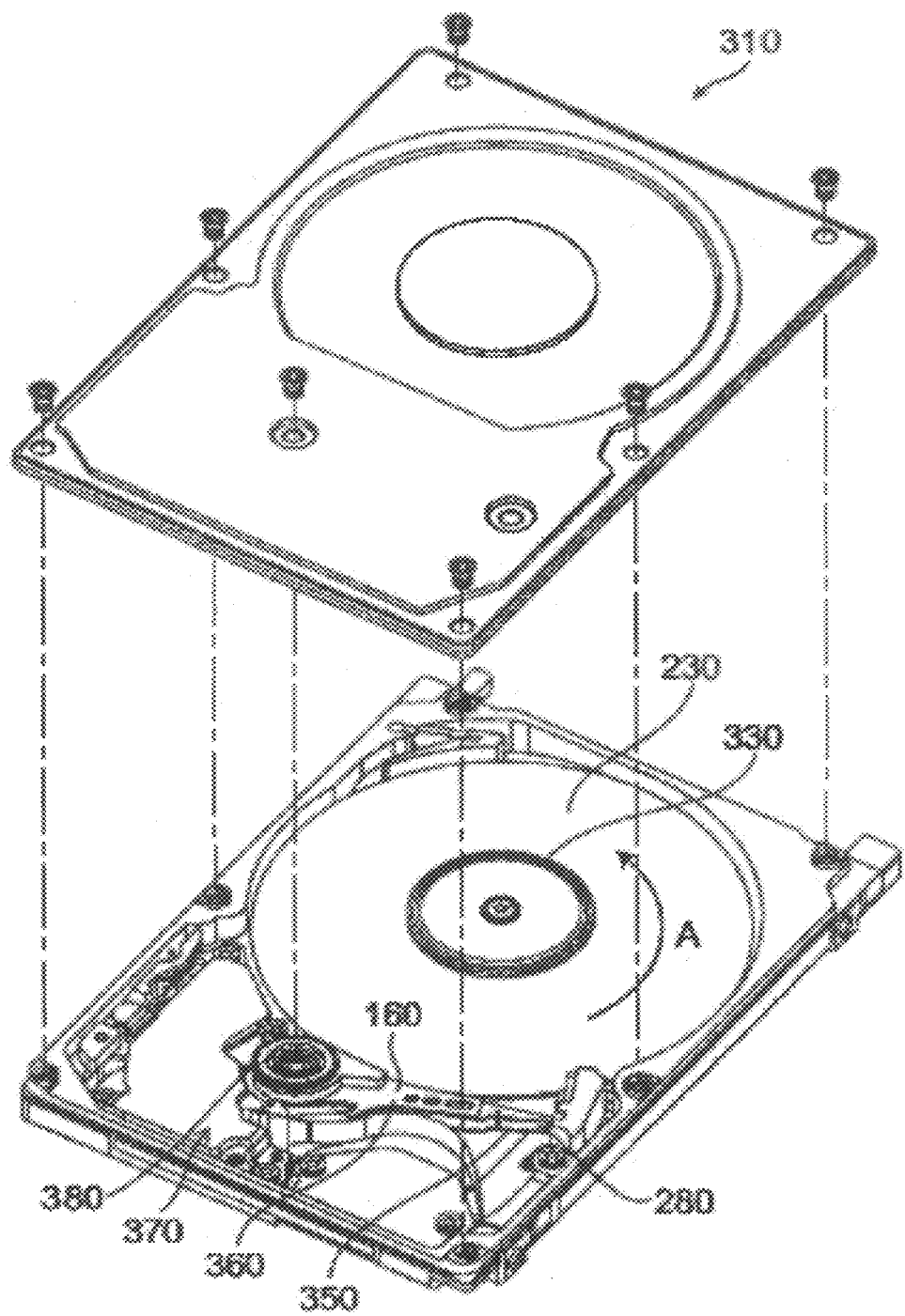
FIG. 12 is a perspective view showing a magnetic recording/reproducing apparatus in accordance with a third embodiment.

FIG. 12 is a perspective view showing the magnetic recording/reproducing apparatus in accordance with the third embodiment.

As shown in FIG. 12, the magnetic recording/reproducing apparatus 310 in accordance with this embodiment is an apparatus employing a rotary actuator. A spindle motor 330 is provided with a recording medium 230, and rotates the recording medium 230 in a medium-moving direction 270 by a motor (not shown) in response to a control signal from a drive control unit (not shown). Alternatively, the magnetic recording apparatus 310 in accordance with this embodiment may be provided with two or more recording media 230.

Figure 13:
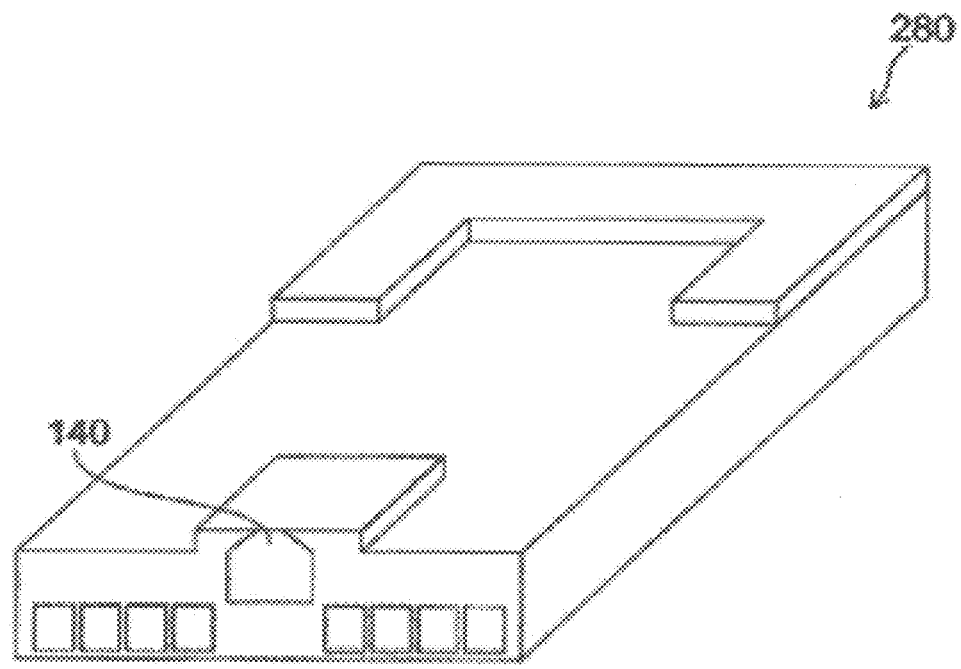
FIG. 13 is a view showing a head slider carrying a magnetic head provided with the magnetoresistive element.

As shown in FIG. 13, a head slider 280 is provided with a magnetic recording head 140 to perform read/write of information to be stored in the recording medium 230. The magnetic recording head 140 is provided with the magnetoresistive element 10. The head slider 280 includes $Al_2O_3$/TiC and is designed so that the head slider 280 is capable of moving relatively to the magnetic recording medium 230 with flying above or in contact with the magnetic recording medium 230.

The head slider 280 is mounted at the tip of a filmy suspension 350. The head slider 280 is provided with the magnetic head 140 near the tip of the head slider 280.

The recording medium disk 230 rotates so that a pressing force due to the suspension 350 is balanced with a force generated over an air-bearing surface (ABS) of the head slider 280. The air-bearing surface of the head slider 280 is suspended over the surface of the recording medium 230 with a prescribed flying height. Alternatively, the head slider 280 may run in contact with the recording medium 230, which is called a "contact run type".

The suspension 350 is connected to an end of an actuator arm 360 including a bobbin to hold a drive coil (not shown). The other end of the actuator arm 360 is provided with a voice coil motor 370, i.e., a linear motor. A voice coil motor 370 can include a drive coil (not shown) and a magnetic circuit. The drive coil is wound up onto the bobbin of the actuator arm 360. The magnetic circuit includes a permanent magnet and a facing yoke so that the drive coil is sandwiched therebetween.

The actuator arm 360 is held by ball bearings which are provided to both the upper and lower sides of a bearing portion 380, and can rotate slidably owing to the voice coil motor 370. As a result, the actuator arm 360 is capable of moving the magnetic recording head to an arbitrary position over the recording medium 230.

Figure 14A:
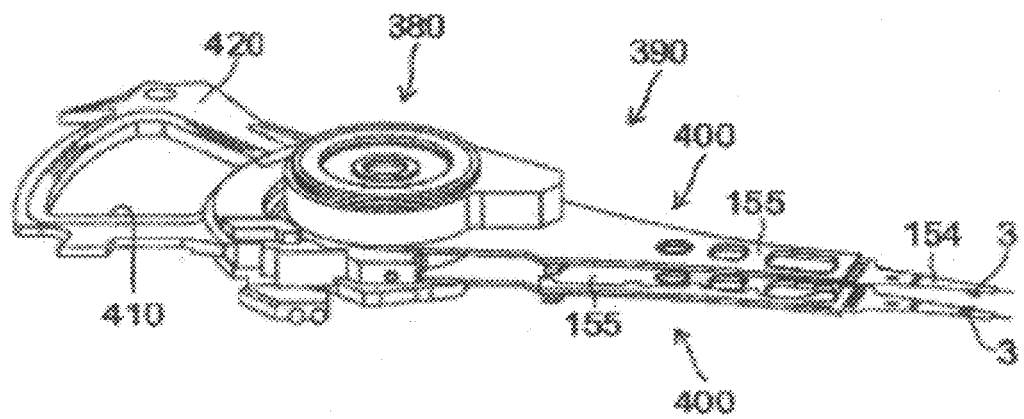
FIG. 14A is a view showing a head stack assembly included in the magnetic recording/reproducing apparatus in accordance with the third embodiment.

FIG. 14A is a view showing a head stack assembly 390 included in the magnetic recording/reproducing apparatus 310 in accordance with the third embodiment.

Figure 14B:
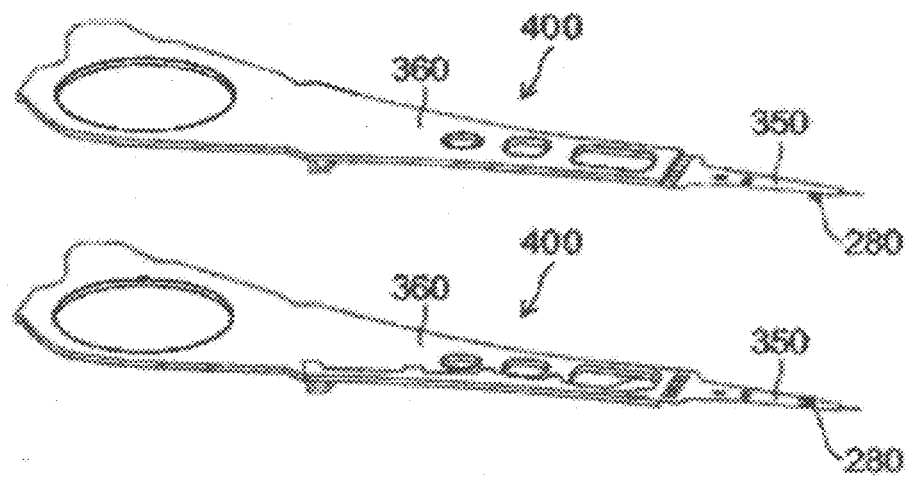
FIG. 14B is a perspective view showing a magnetic head stack assembly to be included in the head stack assembly.

FIG. 14B is a perspective view showing a magnetic head stack assembly (head gimbal assembly referred to as "HGA") 400 to be included in the head stack assembly 390.

As shown in FIG. 14A, the head stack assembly 390 has the bearing portion 380, a head gimbal assembly (HGA) 400 extending from the bearing portion 380, and a suspension flame 420. The suspension flame 420 extends from the bearing portion 380 in a direction opposite to HGA and suspends a coil 410 of the voice coil motor.]

As shown in FIG. 14B, the head gimbal assembly 400 has the actuator arm 360 extending from the bearing portion 380, and the suspension 350 extending from the actuator arm 360.

The head slider 280 is attached at the tip of the suspension 350. The head slider 280 is provided with the magnetic recording head 140 mentioned in the second embodiment.

The magnetic head assembly (head gimbal assembly) 400 in accordance with this embodiment is provided with the magnetic recording head 140 of the second embodiment, the head slider 280 carrying the magnetic recording head 140, the suspension 350 carrying the head slider 280 at one end thereof, and the actuator arm 360 connected to the other end of the suspension 350.

The suspension 350 has a lead for read/write of signals, a lead for a heater to control the flying height and a lead (not shown) for a spin torque oscillator (not shown). These leads are electrically connected to the respective electrodes of the magnetic recording head 140 to be built into the head slider 280. Electrode pads (not shown) are provided to the head gimbal assembly 400. The "electrode pads" are referred to as the "pads" simply below. Eight pads are provided for this embodiment. The head gimbal assembly 400 is provided with two pads for coils of a main magnetic pole (not shown), two pads for a magnetic reproducing element (not shown), two pads for DFH (dynamic flying height), and two pads for the spin torque oscillator.

A signal processor (not shown) is mounted onto, e.g., the back side of the drawing of the magnetic recording apparatus 310 shown in FIG. 12. The signal processor performs read/write of signals from/on the magnetic recording medium 230 using the magnetic recording head 140. Input-output lines of the signal processor are connected to the pads of the head gimbal assembly 400 and are coupled electrically with the magnetic recording head 140.

The magnetic recording/reproducing apparatus 310 in accordance with this embodiment is provided with the magnetic recording medium 230, the magnetic recording head 140, a movable portion, a position controller, and the signal processor. The movable portion allows the magnetic recording medium and the magnetic recording head to relatively move to each other with separating the medium 230 and the head 140 from each other or making the medium 230 and the head 140 in contact with each other while making the medium 230 and the head 140 face each other. The position controller positions the magnetic recording head 140 at a prescribed position on the magnetic recording medium. The signal processor performs read/write of signals from/on the magnetic recording medium 230 using the head 140.

The movable portion can include the head slider 280. The position controller can include the head gimbal assembly 400.

The magnetic recording/reproducing apparatus 310 is provided with the magnetic recording medium 230, the head gimbal assembly 400, and the signal processor to perform read/write of signals from/on the magnetic recording medium 230 using the magnetic recording head 140 carried in the head gimbal assembly 400.

Fourth Embodiment

Next, the fourth embodiment will be described below.

This embodiment provides a magnetic memory including the magnetoresistive elements in accordance with the first embodiment. The magnetoresistive elements of the first embodiment enable it to form a magnetic random access memory (MRAM) where memory cells are arranged in a matrix.

Figure 15:
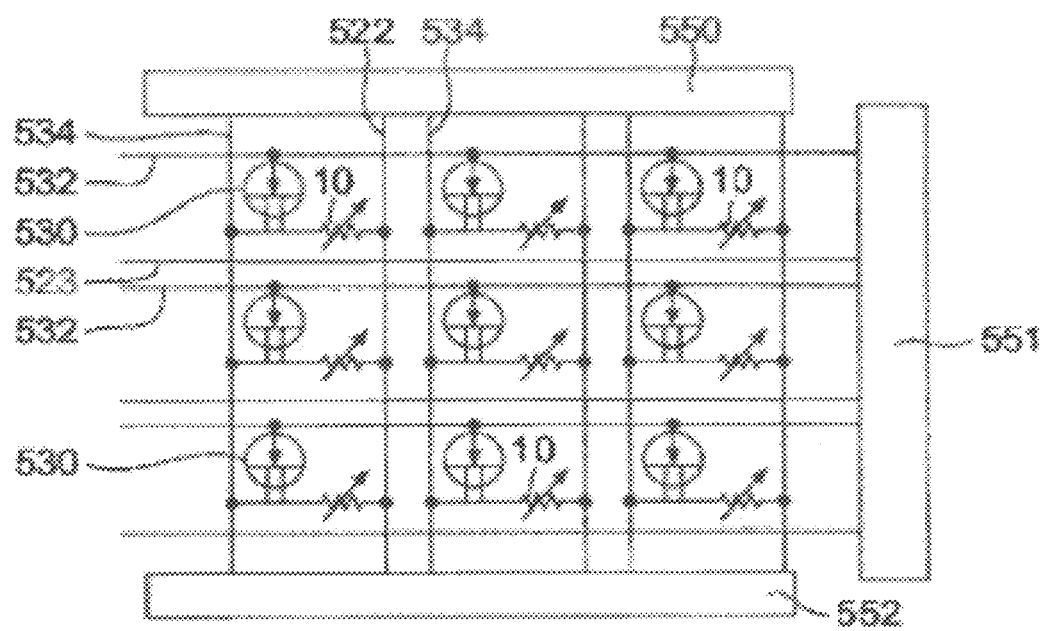
FIG. 15 is a circuit diagram showing a magnetic memory in accordance with a fourth embodiment.

FIG. 15 is a circuit diagram showing the magnetic memory in accordance with the fourth embodiment.

FIG. 15 shows a circuit configuration which arranges memory cells in an array. As shown in FIG. 15, the magnetic memory is provided with a column decoder 550 and a row decoder 551 to select a cross point (a bit) therein. Only one switching transistor 530 is selected by a bit line 534 and a word line 532 to be switched on, thereby allowing it to detect a current passing through a specific magnetoresistive element 10 using a sense amplifier 552 and to read out the bit information stored in a magnetic recording layer (a free layer) of the specific magnetoresistive element 10. When a bit of information is written, a current is passed through a specific written word line 523 and a specific written bit line 522 to generate a writing magnetic field and to apply the writing magnetic field to the free layer.

Figure 16:
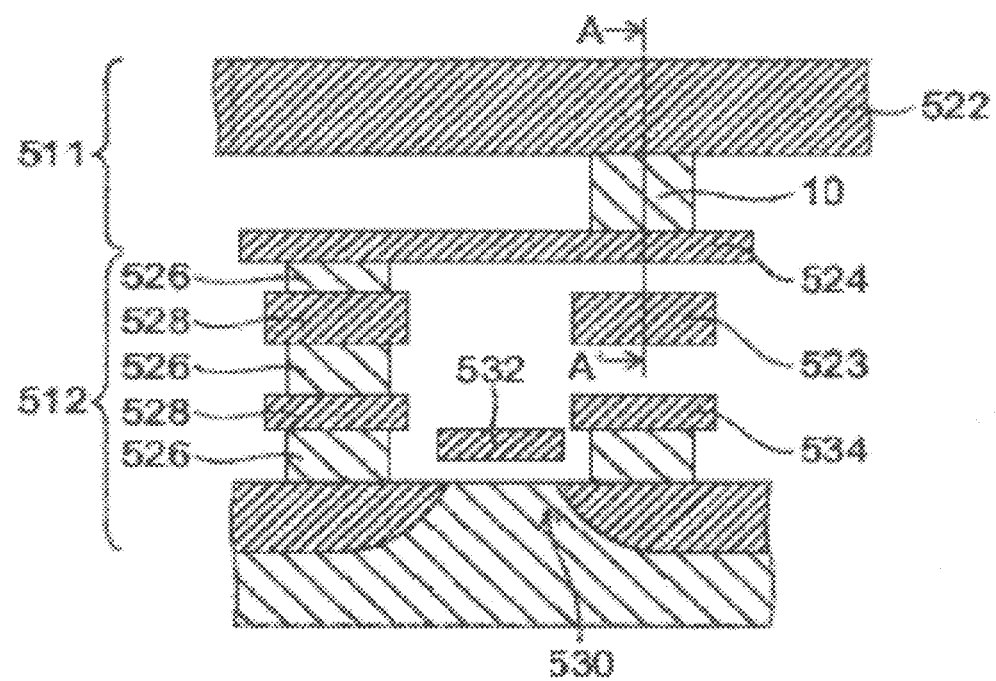
FIG. 16 is a sectional view illustrating a substantial part of the magnetic recording/reproducing apparatus in accordance with the fourth embodiment.

FIG. 16 is a sectional view illustrating a substantial part of the magnetic recording/reproducing apparatus in accordance with the fourth embodiment.

Figure 17:
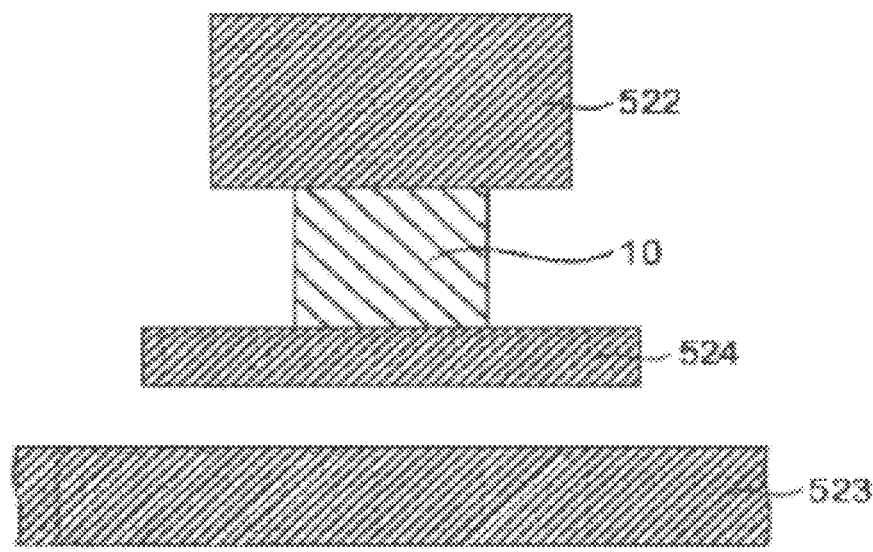
FIG. 17 is a sectional view cut along the broken line XVII-XVII in FIG. 16.

FIG. 17 is a sectional view cut along the broken line XVII-XVII in FIG. 16.

FIGS. 16 and 17 correspond to a structure of the one-bit memory cell included in the magnetic recording/reproducing apparatus (magnetic memory) shown in FIG. 15.

As shown in FIGS. 16 and 17, this memory cell includes a storage cell 511 and a transistor 512 for address selection.

The storage cell 511 has the magnetoresistive element 10 and a pair of lines 522, 524 which are connected to the magnetoresistive element 10. The magnetoresistive element 10 is one of the magnetoresistive elements (CCP-CPP elements) in accordance with the embodiments mentioned above.

On the other hand, the transistor 512 for address selection is provided with the switching transistor 530 connected thereto through a via hole 526 and a buried line 528. The switching transistor 530 switches a current pass between the magnetoresistive element 10 and the line 534 in response to a voltage applied to a gate 532.

In addition, a writing line 523 is provided in a direction substantially vertical to a line 522 under the magnetoresistive element 101. These lines 522, 523 can be formed employing one of aluminum (Al), copper (Cu), tungsten (W), tantalum (Ta), or an alloy including any of these, for example.

Write is performed in such a memory cell as follows. Respective writing pulse currents are passed through the lines 422, 423 to write bit information in the magnetoresistive element 1, and form a superposed magnetic field of two magnetic fields generated by the respective writing pulse currents. The superposed magnetic field is applied to the recording layer of the magnetoresistive element to switch the magnetization of the recording layer.

Moreover, read is performed as follows. A sense current is passed through the line 522, the magnetoresistive element 10 including the magnetic recording layer and the line 424 to estimate the resistance or resistance change of the magnetoresistive element 10.

The magnetic memory in accordance with the embodiment employing the magnetoresistive element in accordance with the embodiments mentioned above enables it to firmly perform write and read by controlling firmly magnetic domains of the recording layer and by writing firmly on the recording layer, even though the memory cell is to be downsized.

Fifth Embodiment

Next, a fifth embodiment will be described below.

This embodiment provides a magnetic memory including the magnetoresistive elements in accordance with the first embodiment.

Figure 18:
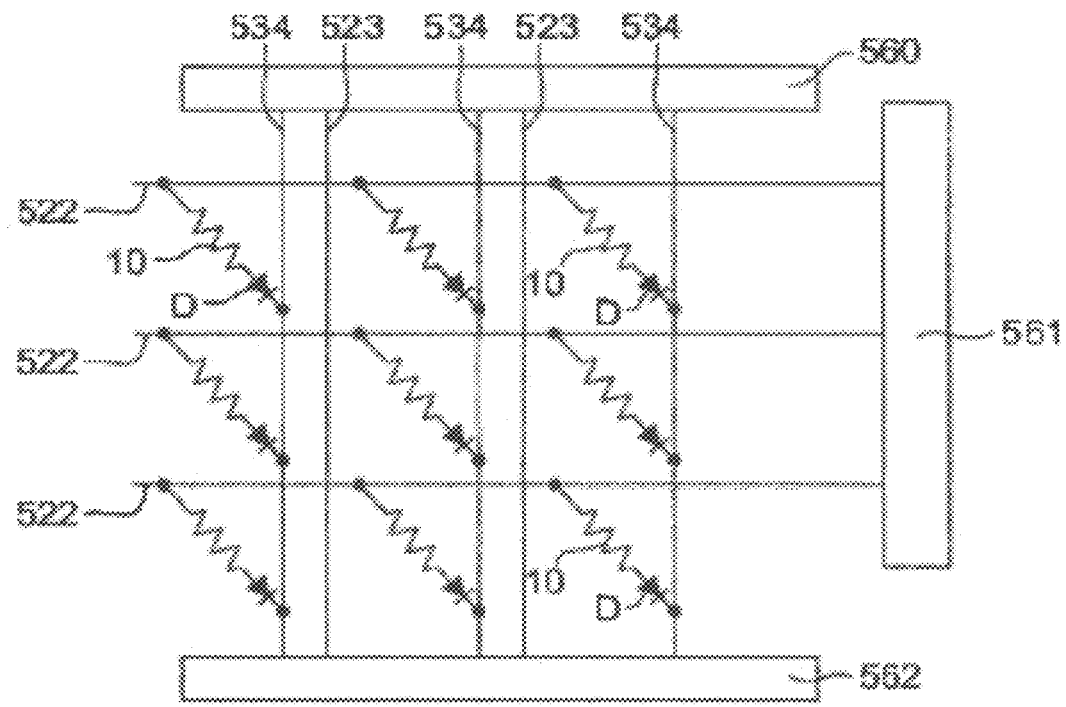
FIG. 18 is a circuit diagram showing the magnetic memory in accordance with the fifth embodiment.

FIG. 18 is a circuit diagram showing the magnetic memory in accordance with the fifth embodiment.

As shown in FIG. 18, the bit lines 522 and the word lines 534 are arranged in a matrix in this embodiment. A specific bit line 522 and a specific word line 534 are selected by the decoders 561 and 560, respectively, so that a specific memory cell is selected in the matrix. Each memory cell includes the diode D and the magnetoresistive element 10 both being connected in series. Here, the diode D prevents a sense current from bypassing any memory cells other than the memory cell including the selected magnetoresistive element 10. Write is performed with a magnetic field to be generated by passing a current through a specific bit line 522 and a specific word line 534.

The same reference numerals in this embodiment will be used to denote the same or like parts as those in the fourth embodiment. The same description will not be repeated.

Example 1

A magnetoresistive element 10 of an example 1 in accordance with the first embodiment was prepared and evaluated for an RA value and an MR change rate. As shown in FIG. 1, a spacer layer was prepared employing a structure including a first metal layer/an oxide layer/a second metal layer.

The oxide layer 21 was formed as follows. A 1 nm-thick Fe layer was formed on the first metal layer. Subsequently, a 0.6 nm-thick Zn layer was formed on the 1 nm-thick Fe layer. The IAO processing changed the prepared Fe[1 nm]/Zn[0.6 nm] layer into a mixed oxide layer. The film thickness of the mixed oxide layer was 1.5 nm. The oxygen amount of exposure was set to $3.0 \times 10^4$ Langmiur.

A configuration of the magnetoresistive element 10 formed will be described below as the example 1.

An underlayer 12 is Ta[1 nm]/Ru[2 nm];

a pinning Layer 13 is $Ir_{22}Mn_{78}$[7 nm];

a magnetization fixed layer 14 is $Co_{90}Fe_{10}$[4.4 nm]/Ru[0.9 nm]/$Fe_{50}Co_{50}$[4 nm];
a first metal layer is Cu[0.5 nm];
an oxide Layer 21 is Zn—Fe—O[1.5 nm];
a second metal layer is Cu[0.5 nm]; and
a magnetization free layer 18 is $Fe_{50}Co_{50}$[3 nm].
After annealing the multilayer including the above layers at 280° C. for 5 hours, electrodes 11 and 20 were finally formed.

Figure 11:
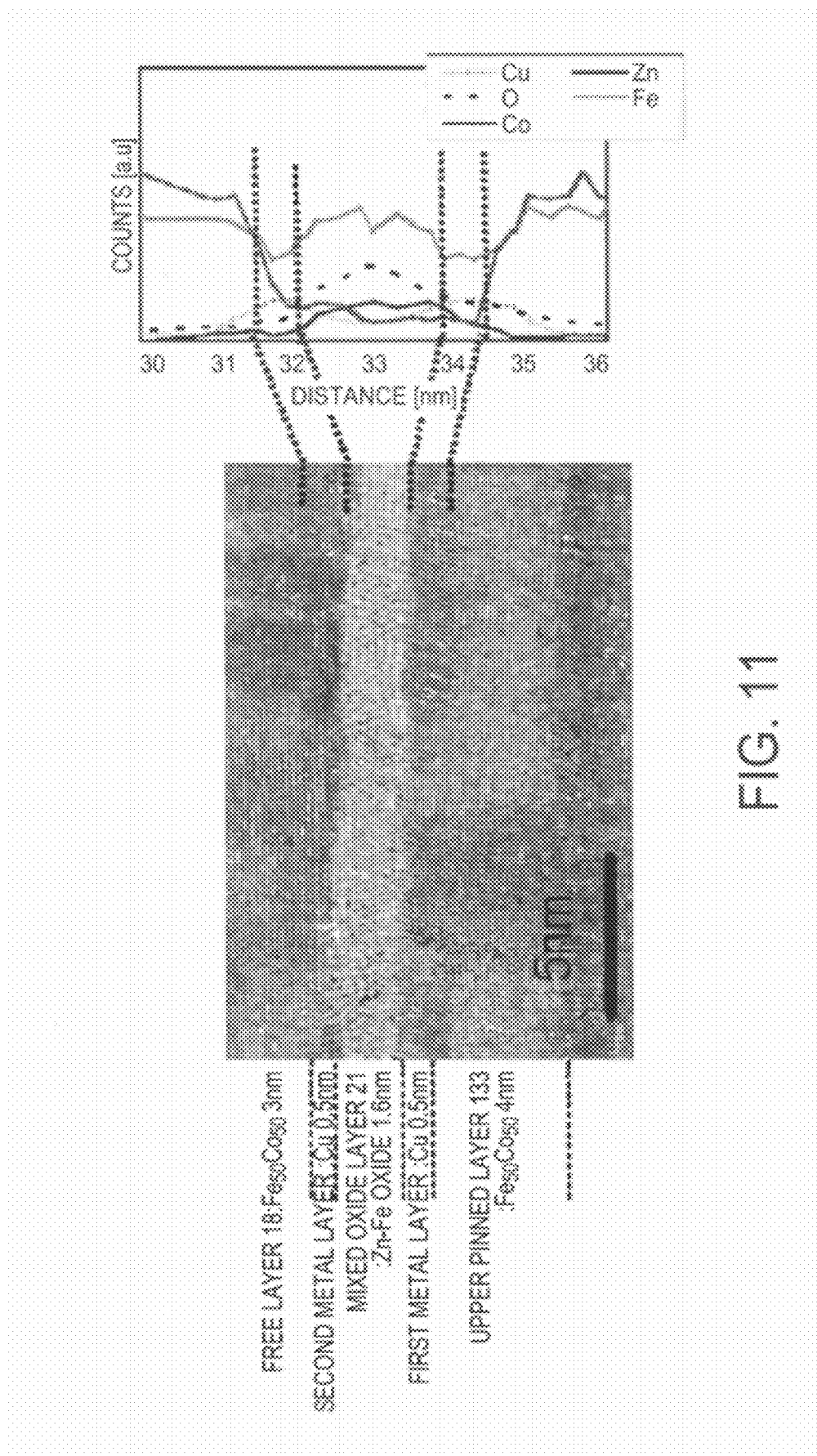
FIG. 11 is a view showing a cross-sectional TEM image of the magnetoresistive element of an example.

FIG. 11 is a view showing a cross-sectional TEM image of the magnetoresistive element 10 of this example. It is shown that the oxide layer 21 is formed homogeneously in the spacer layer.

The EDX line analysis is also shown in FIG. 11. The line analysis well corresponds to the cross-sectional TEM image of the magnetoresistive element 10 of this example. The portion of the oxide layer 21 shows the respective peaks of Zn, Fe, and O. The line analysis reveals that a well-mixed oxide layer including Zn and Fe has been formed.

In addition, the TEM image and the EDX line analysis show a formation of the well-mixed oxide layer in another magnetoresistive element in accordance with the example 1.

The magnetoresistive element 10 of this example had an RA value of $0.21\Omega\mu m^2$ and an MR change rate of 10%.

Example 2

A magnetoresistive element 10 of an example 2 in accordance with the first embodiment was prepared to be evaluated for an RA value and an MR change rate. As shown in FIG. 1, a spacer layer was prepared employing a structure including a first metal layer/an oxide layer/a second metal layer. The example 2 differs from the example 1 in that the first and second metal layers employ Zn instead of Cu employed in the example 1.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a first metal layer is Zn[0.5 nm];
n oxide Layer 21 is Zn—Fe—O[1.5 nm];
a second metal layer is Zn[0.5 nm]; and
a magnetization free layer 18 is $Fe_{50}Co_{50}$[3 nm].
The magnetoresistive element 10 of this example had an RA value of $0.20\Omega\mu m^2$ and an MR change rate of 9.0%.

Example 3

A magnetoresistive element 10 of an example 3 in accordance with the first embodiment was prepared to be evaluated for an RA value and an MR change rate. As shown in FIG. 1, a spacer layer was prepared employing a structure including a first metal layer/an oxide layer/a second metal layer. The example 3 differs from the example 1 in that the second metal layer employs Zn instead of Cu employed in the example 1.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a first metal layer is Cu[0.5 nm];
an oxide Layer 21 is Zn—Fe—O[1.5 nm];
a second metal layer is Zn[0.5 nm]; and
a magnetization free layer 18 is $Fe_{50}Co_{50}$[3 nm].
The magnetoresistive element 10 of this example had an RA value of $0.20\Omega\mu m^2$ and an MR change rate of 14.0%.

Example 4

A magnetoresistive element 10 of an example 4 in accordance with the first embodiment was prepared to be evaluated for an RA value and an MR change rate. As shown in FIG. 1, a spacer layer was prepared employing a structure including a first metal layer/an oxide layer/a second metal layer. The example 4 differs from the example 1 in that the first and second metal layers employ Ag instead of Cu employed in the example 1.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a first metal layer is Ag[0.5 nm];
an oxide Layer 21 is Zn—Fe—O[1.5 nm];
a second metal layer is Ag[0.5 nm]; and
a magnetization free layer 18 is $Fe_{50}Co_{50}$[3 nm].
The magnetoresistive element 10 of this example had an RA value of $0.20\Omega\mu m^2$ and an MR change rate of 9.2%.

Example 5

A magnetoresistive element 10 of an example 5 in accordance with the first embodiment was prepared to be evaluated for an RA value and an MR change rate. As shown in FIG. 1, a spacer layer was prepared employing a structure including a first metal layer/an oxide layer/a second metal layer. The example 5 differs from the example 1 in that the first and second metal layers employ Au instead of Cu employed in the example 1.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a first metal layer is Au[0.5 nm];
an oxide Layer 21 is Zn—Fe—O[1.5 nm];
a second metal layer is Ag[0.5 nm]; and
a magnetization free layer 18 is $Fe_{50}Co_{50}$[3 nm].
The magnetoresistive element 10 of this example had an RA value of $0.20\Omega\mu m^2$ and an MR change rate of 7.5%.

Example 6

A magnetoresistive element 10 of an example 6 in accordance with the first embodiment was prepared to be evaluated for a RA value and an MR change rate. As shown in FIG. 1, a spacer layer was prepared employing a structure including a first metal layer/an oxide layer/a second metal layer. The example 6 differs from the example 1 in the material of an oxide layer.

The oxide layer 21 was formed as follows. A 1 nm-thick $Fe_{50}Co_{50}$ layer was formed on the first metal layer. Subsequently, a 0.6 nm-thick Zn layer was formed on the 1 nm-thick $Fe_{50}Co_{50}$ layer. The IAO processing changed the prepared $Fe_{50}Co_{50}$[1 nm]/Zn[0.6 nm] layer into a mixed oxide layer (denoted as Zn—$Fe_{50}Co_{50}$—O). The film thickness of the mixed oxide layer was 1.7 nm. The oxygen amount of exposure was set to $3.0 \times 10^4$ Langmiur.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
the first metal layer is Cu[0.5 nm];
the oxide Layer 21 is Zn—$Fe_{50}Co_{50}$—O[1.5 nm];
the second metal layer is Zn[0.5 nm]; and
a magnetization free layer 18 is $Fe_{50}Co_{50}$[3 nm].
The magnetoresistive element 10 of this example had an RA value of $0.2\Omega\mu m^2$ and an MR change rate of 13.5%.

Examples 7 to 11

Comparative Examples 1 and 2

RA values of magnetoresistive elements 10 as shown in FIG. 1 and resistivity of an oxide layer included therein were controllably changed by the oxygen amount of exposure. Examples 7 to 11 and comparative examples 1, 2 differ from the example 1 in the film thickness of the oxide layer 21. The magnetoresistive elements were examined for the RA values thereof and the resistivities of the oxide layers both having influences on the MR change rate thereof.

Each layer of the magnetoresistive elements 10 of the examples 7 to 11 and comparative examples 1, 2 will be described below.

An underlayer 12 is Ta[1 nm]/Ru[2 nm];

a pinning Layer 13 is $Ir_{22}Mn_{78}$[7 nm];

a magnetization fixed layer 14 is $Co_{90}Fe_{10}$[4.4 nm]/Ru[0.9 nm]/$Fe_{50}Co_{50}$[4 nm];

a first metal layer is Cu[0.5 nm];

the oxide Layer 21 is Zn—Fe—O[1 nm];

a second metal layer is Zn[0.5 nm]; and a magnetization free layer 18 is $Fe_{50}Co_{50}$[3 nm].

The oxide layer 21 was formed as follows. A 1 nm-thick Fe layer was formed on the Cu spacer layer. Subsequently, a 0.6 nm-thick Zn layer was formed on the 1 nm-thick Fe layer. Next, the IAO processing changed the prepared Fe[1 nm]/Zn [0.6 nm] layer into a Zn—Fe—O mixed oxide layer. Then, the reduction processing was applied using Ar-plasma irradiation. The magnetoresistive elements with various RA values and MR change rates were prepared in order to examine the influence of the RA values and resisitivies of the oxide layers included therein on the MR change rates thereof. The RA values and the resisitivies were controllably changed by the oxygen amounts of exposure during the preparation of the oxide layers. The oxygen amounts of exposure were $1.2 \times 10^4$ Langmiur, $1.5 \times 10^4$ Langmiur, $1.8 \times 10^4$ Langmiur, $3.0 \times 10^4$ Langmiur, and $4.5 \times 10^4$ Langmiur for the examples 7, 8, 9, 10, and 11, respectively. The oxygen amount of exposure was $6.0 \times 10^4$ Langmiur for the comparative example 2.

TABLE 1 lists the examples 7 to 11 and the comparative example 1, 2 to show the influence of the RA values and the resisitivies of the Zn—Fe—O oxide layers included therein on the MR change rates of the magnetoresistive elements. The RA values and the resisitivies of the Zn—Fe—O oxide layers were changed by the oxygen amounts of exposure during IAO. The magnetoresistive element of the comparative example 1 lacks the Zn—Fe—O oxide layer.

TABLE 1

| | OXYGEN AMOUNT OF EXPOSURE FOR IOA (Lanmuir) | MR (%) | RA ($\Omega\mu m^2$) | $\rho$Zn—Fe—O ($\mu\Omega cm$) |
|---|---|---|---|---|
| COMPARATIVE EXAMPLE 1 | | 1.5 | 0.05 | |
| EXAMPLE 7 | $1.2 \times 10^4$ | 13 | 0.15 | $1.0 \times 10^4$ |
| EXAMPLE 8 | $1.5 \times 10^4$ | 15 | 0.25 | $2.0 \times 10^4$ |
| EXAMPLE 9 | $1.8 \times 10^4$ | 15.5 | 0.55 | $5.0 \times 10^4$ |
| EXAMPLE 10 | $3.0 \times 10^4$ | 15 | 1 | $1.0 \times 10^4$ |
| EXAMPLE 11 | $4.5 \times 10^4$ | 5.5 | 5 | $5.0 \times 10^4$ |
| COMPARATIVE EXAMPLE 2 | $6.0 \times 10^4$ | 1.2 | 10 | $1.0 \times 10^4$ |

The resistivity of the Zn—Fe—O oxide layer was derived from the following equation, provided that the resistivity, the film thickness, and the resistivity increment were expressed by $\rho_{Zn\text{-}Fe\text{-}O}$, $t_{Zn\text{-}Fe\text{-}O}$, $\Delta RA_{Zn\text{-}FE\text{-}O}$, respectively.

$$\rho_{Zn\text{-}Fe\text{-}O} = \frac{\Delta RA_{Zn\text{-}Fe\text{-}O}}{t_{Zn\text{-}Fe\text{-}O}} \quad [\text{EQUATION 1}]$$

The film thickness $t_{Zn\text{-}Fe\text{-}O}$ of the Zn—Fe—O oxide layer was derived from the cross-sectional TEM image. The film thickness was estimated as being 1.5 nm for the examples 7, 8, 9, and the comparative example 2. $\Delta RA_{Zn\text{-}Fe\text{-}O}$ was estimated as a difference of the RA value of the magnetoresistive element without the oxide layer from the RA value of the magnetoresistive element with the oxide layer.

TABLE 1 shows that the MR change rate increases in comparison with the comparative examples when $\rho_{Zn\text{-}Fe\text{-}O}$ is $5 \times 10^5 \mu\Omega cm$ or less. TABLE 1 also shows that the MR change rate increases remarkably when $\rho_{Zn\text{-}Fe\text{-}O}$ is $1 \times 10^5 \mu\Omega cm$ or less. The MR change rates of the examples increase in comparison with the MR change rate of the comparative examples when $\rho_{Zn\text{-}Fe\text{-}O}$ is $5 \times 10^5 \mu\Omega cm$ or less and remarkably when $\rho_{Zn\text{-}Fe\text{-}O}$ is $1 \times 10^5 \mu\Omega cm$ or less.

The above results are considered to be due to a reduction in spin-flip inside the Zn—Fe—O oxide layer. When the Zn—Fe—O oxide layer has a low resistivity, the spin-flip is considered to be reduced thereinside. An appropriate oxygen amount of exposure provides the Zn—Fe—O oxide layer with a low resistivity.

Examples 12 to 17

RA values of the magnetoresistive elements 10 as shown in FIG. 1 and a resistivity of an oxide layer included therein were controllably changed by the oxygen amount of exposure. Examples 12 to 17 differ from the example 3 in the film thickness of a first metal layer. The process for preparing the examples 12 to 17 is the same as that for the example 3.

An underlayer 12 is Ta[1 nm]/Ru[2 nm];

a pinning Layer 13 is $Ir_{22}Mn_{78}$[7 nm];

a magnetization fixed layer 14 is $Co_{90}Fe_{10}$[4.4 nm]/Ru[0.9 nm]/$Fe_{50}Co_{50}$[4 nm];

the first metal layer is Cu[0.5 nm];

the oxide Layer 21 is Zn—Fe—O[1.5 nm];

a second metal layer is Zn[0.5 nm]; and a magnetization free layer 18 is $Fe_{50}Co_{50}$[3 nm].

TABLE 2

| | FIRST METAL LAYER | MR (%) | RA ($\Omega\mu m^2$) |
|---|---|---|---|
| COMPARATIVE EXAMPLE 1 | | 1.5 | 0.05 |
| EXAMPLE 12 | Cu 0.5 nm | 16 | 0.24 |

TABLE 2-continued

|  | FIRST METAL LAYER | MR (%) | RA ($\Omega\mu m^2$) |
|---|---|---|---|
| EXAMPLE 13 | Cu 0.75 nm | 15.5 | 0.23 |
| EXAMPLE 14 | Cu 1 nm | 14 | 0.23 |
| EXAMPLE 15 | Cu 1.5 nm | 12.5 | 0.25 |
| EXAMPLE 16 | Cu 2 nm | 12 | 0.24 |
| EXAMPLE 17 | Cu 3 nm | 9.5 | 0.24 |

The magnetoresistive elements of the examples 12 to 17 were prepared to be evaluated for an MR change rate and an RA value as shown in TABLE 2. TABLE 2 shows that the MR change rates increase in all the examples provided with the first metal layer having a film thickness of 0.5 nm to 3 nm. Moreover, when the film thickness of the first metal layer is 2 nm or less, a high MR change rate is acquired. When the film thickness thereof is 1 nm or less, a remarkably high MR change rate is acquired. This can be understood in terms of a reduction in the spin filter effect on the side of the magnetization fixed layer. The reduction in the spin filter effect is caused by a reduction in the spin accumulation from the magnetization fixed layer 13 to the interface with the oxide layer. The spin accumulation reduces with thickening the first metal layer. The first metal layer is preferably thinner to enhance the spin filter effect on the side of the magnetization fixed layer. On the other hand, the first metal layer is preferably thicker to some degree in order to sufficiently decouple the magnetic coupling between the magnetization fixed layer and the magnetization free layer. Such a trade-off requires a preferable film thickness of the first metal layer.

Examples 18 to 23

RA values of the magnetoresistive elements 10 as shown in FIG. 1 and a resistivity of an oxide layer included therein were controllably changed with changing the film thickness of the second metal layer. The influence of the film thickness on the MR change rate was examined. Examples 18 to 23 differ from the example 3 in the film thickness of a second metal layer.
An underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a first metal layer is Cu[0.5 nm];
the oxide Layer 21 is Zn—Fe—O[1.5 nm];
the second metal layer is Zn[listed in TABLE 3]; and
a magnetization free layer 18 is $Fe_{50}Co_{50}$[3 nm].

TABLE 3

|  | SECOND METAL LAYER 17 | MR (%) | RA ($\Omega\mu m^2$) |
|---|---|---|---|
| COMPARATIVE EXAMPLE 1 |  | 1.5 | 0.05 |
| EXAMPLE 18 | Zn 0.5 nm | 16 | 0.24 |
| EXAMPLE 19 | Zn 0.75 nm | 14.5 | 0.23 |
| EXAMPLE 20 | Zn 1 nm | 13 | 0.25 |
| EXAMPLE 21 | Zn 1.5 nm | 11 | 0.23 |
| EXAMPLE 22 | Zn 2 nm | 10.4 | 0.22 |
| EXAMPLE 23 | Zn 3 nm | 7 | 0.24 |

The magnetoresistive elements of the examples 18 to 23 were prepared to be evaluated for an MR change rate and an RA value as shown in TABLE 3. TABLE 3 shows that the MR change rates increase in all the examples provided with the first metal layer having a film thickness of 0.5 nm to 3 nm. Moreover, when the film thickness of the second metal layer is 2 nm or less, a high MR change rate is acquired. When the film thickness thereof is 1 nm or less, a remarkably high MR change rate is acquired. This can be understood in terms of a reduction in the spin filter effect on the side of the magnetization free layer. The reduction in the spin filter effect is caused by a reduction in the spin accumulation from the magnetization free layer 16 to the interface with the oxide layer. The spin accumulation reduces with thickening the first metal layer. The second metal layer is preferably thinner to enhance the spin filter effect on the side of the magnetization free layer. On the other hand, the first metal layer is preferably thicker to some degree in order to sufficiently decouple the magnetic coupling between the magnetization fixed layer and the magnetization free layer. Such a trade-off requires a preferable film thickness of the second metal layer.

Examples 24 to 33

The magnetoresistive elements 10 in accordance with the first embodiment were prepared to be evaluated for a RA value and an MR change rate. As shown in FIG. 1, a spacer layer was prepared employing a structure including a first metal layer/an oxide layer/a second metal layer. Examples 24 to 33 differ from the example 3 in the film thickness of an oxide layer.
A underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
the first metal layer is Cu[0.5 nm];
the oxide Layer 21 is Zn—Fe—O[listed in TABLE 5];
the second metal layer is Zn[0.5 nm]; and
a magnetization free layer 18 is $Fe_{50}Co_{50}$[3 nm].

TABLE 4

|  | FILM THICKNESS OF Zn—Fe OXIDE LAYER | MR (%) | RA ($\Omega\mu m^2$) |
|---|---|---|---|
| COMPARATIVE EXAMPLE 1 | 0 | 1.5 | 0.05 |
| EXAMPLE 24 | 0.2 | 3.7 | 0.13 |
| EXAMPLE 25 | 0.5 | 8.5 | 0.16 |
| EXAMPLE 26 | 1 | 13.5 | 0.18 |
| EXAMPLE 27 | 1.5 | 14 | 0.2 |
| EXAMPLE 28 | 2 | 13.2 | 0.24 |
| EXAMPLE 29 | 2.5 | 12 | 0.3 |
| EXAMPLE 30 | 3 | 10.2 | 0.32 |
| EXAMPLE 31 | 3.5 | 9.5 | 0.35 |
| EXAMPLE 32 | 4 | 8.2 | 0.4 |
| EXAMPLE 33 | 5 | 5 | 0.67 |

The magnetoresistive elements of the examples 18 to 23 were evaluated for an MR change rate and an RA value as shown in TABLE 4. TABLE 4 shows that the MR change rates are enhanced in all the examples provided with the oxide layer 21 having a film thickness of 0.2 nm to 5 nm. Moreover, when the film thickness of the oxide layer 21 is not less than 0.5 nm and not more than 4 nm, a high MR change rate is acquired.

Example 34

The magnetoresistive element 10 in accordance with the second embodiment was prepared to be evaluated for an RA value and an MR change rate. As shown in FIG. 4, a spacer layer was prepared employing an oxide layer 21.

A underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
the oxide Layer 21 is Zn—Fe—O[1.5 nm]; and
a magnetization free layer 18 is $Fe_{50}Co_{50}$[3 nm].
The magnetoresistive element 10 of this example had an RA value of $0.2\Omega\mu m^2$ and an MR change rate of 14%, showing larger values than those of the comparative example 1. The magnetoresistive element 10 in accordance with the second embodiment shows an enhanced MR change rate in the same way as that in accordance with the first embodiment. The oxide layer probably enables it to enhance spin-dependent scattering and to reduce spin-flip as a result of the low resistivity thereof. This is the mechanism that the MR change rate is enhanced.

The magnetoresistive element of the example 1 is provided with the first and second metal layers. On the contrary, the magnetoresistive element of the example 28 is provided with no metal layer. Both the magnetoresistive elements of the examples 1 and 28 were evaluated for an interlayer-coupling magnetic field, yielding 45 Oe and 95 Oe, respectively. This result shows the following fact. An entire spacer layer formed of oxide provides a high MR change rate, whereas the spacer layer with the first and second metal layers attenuates the interlayer coupling between the magnetization free layer and the magnetization fixed layer. This will be desirable for a reduction in a magnetic noise.

Comparative Example 1

The magnetoresistive element without an oxide layer was prepared and was evaluated for an RA value and an MR change rate.
A underlayer 12 is Ta[1 nm]/Ru[2 nm];
a pinning Layer 13 is $Ir_{22}Mn_{78}$[7 nm];
a magnetization fixed layer 14 is $Co_{90}Fe_{10}$[4.4 nm]/Ru[0.9 nm]/$Fe_{50}Co_{50}$[4 nm];
a spacer Layer 16 is Cu[3 nm];
a magnetization free layer 18 is $Fe_{50}Co_{50}$[4 nm].
The magnetoresistive element 10 of the comparative example had an RA value of $0.08\Omega\mu m^2$ and an MR change rate of 1.5%.

The magnetoresistive elements 10 of the examples 1 to 34 show higher MR change rates than the comparative example 1. The magnetoresistive elements 10 in accordance with the first and second embodiments enable it to enhance an MR change rate.

The enhancement of the MR change rate is probably based on the following mechanism. The oxide layer enhances spin-dependent scattering and reduces spin-flip as a result of the low resistivity thereof to provide a high spin filter effect.

As mentioned above, all magnetoresistive elements, magnetic head, magnetic recording/reproducing apparatuses, and magnetic memories which one ordinarily skilled in the art can modify on the basis of the magnetic head and the magnetic recording/reproducing apparatus of the above embodiments may employ the magnetoresistive element in accordance with this invention.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A magnetoresistive element comprising:
   a lamination body and a pair of electrodes,
     the lamination body including:
       a first magnetic layer;
       a second magnetic layer; and
       a spacer layer to be provided between the first magnetic layer and the second magnetic layer, the spacer layer including an oxide layer which includes at least one element selected from the group consisting of Zn, In, Sn, and Cd, and at least one element selected from the group consisting of Fe, Co, and Ni;
   wherein the spacer layer further includes a first metal layer and a second metal layer; and
   the oxide layer is provided between the first metal layer and the second metal layer.

2. The element according to claim 1, wherein the first metal layer and the second metal layer include at least one element selected from the group consisting of Cu, Ag, Au, and Zn.

3. The element according to claim 1, wherein the oxide layer further includes at least one element selected from the group consisting of Al, B, Ga, In, C, Si, Ge, and Sn.

4. The element according to claim 1, wherein a film thickness of the oxide layer is not less than 0.5 nm and not more than 4 nm.

5. The element according to claim 1, wherein the first metal layer and the second metal layer have a film thickness of 2 nm or less.

6. A magnetic head assembly comprising:
   a suspension carrying the magnetoresistive element according to claim 1 at one end thereof; and
   an actuator arm to be connected to the other end of the suspension.

7. A magnetic recording/reproducing apparatus comprising the magnetic head assembly according to claim 6 and a magnetic recording medium.

8. A magnetoresistive element comprising:
   a lamination body and a pair of electrodes,
     the lamination body including:
       a first magnetic layer;
       a second magnetic layer; and
       a spacer layer to be provided between the first magnetic layer and the second magnetic layer, the spacer layer including an oxide layer which includes at least one element selected from the group consisting of Zn, In, Sn, and Cd, and at least one element selected from the group consisting of Fe, Co, and Ni;
   wherein the oxide layer has a resistivity of $5 \times 10^5$ μΩcm or less.

9. The element according to claim 8, wherein the oxide layer further includes at least one element selected from the group consisting of Al, B, Ga, In, C, Si, Ge, and Sn.

10. The element according to claim 8, wherein a film thickness of the oxide layer is not less than 0.5 nm and not more than 4 nm.

11. A magnetic head assembly comprising:
    a suspension carrying the magnetoresistive element according to claim 8 at one end thereof; and
    an actuator arm to be connected to the other end of the suspension.

12. A magnetic recording/reproducing apparatus comprising the magnetic head assembly according to claim 11 and a magnetic recording medium.

13. A magnetoresistive element comprising:
a lamination body and a pair of electrodes,
the lamination body including:
a first magnetic layer;
a second magnetic layer; and
a spacer layer to be provided between the first magnetic layer and the second magnetic layer, the spacer layer including an oxide layer which includes at least one element selected from the group consisting of Zn, In, Sn, and Cd, and at least one element selected from the group consisting of Fe, Co, and Ni;
wherein having an areal resistance of $5\Omega\mu m^2$ or less, the areal resistance being a product of an area by a resistance, the area being a cross section of the element through which a current is passed in a lamination direction thereof.

14. The element according to claim 13, wherein the oxide layer further includes at least one element selected from the group consisting of Al, B, Ga, In, C, Si, Ge, and Sn.

15. The element according to claim 13, wherein a film thickness of the oxide layer is not less than 0.5 nm and not more than 4 nm.

16. A magnetic head assembly comprising:
a suspension carrying the magnetoresistive element according to claim 13 at one end thereof; and
an actuator arm to be connected to the other end of the suspension.

17. A magnetic recording/reproducing apparatus comprising the magnetic head assembly according to claim 16 and a magnetic recording medium.

* * * * *